US011543469B2

(12) United States Patent
Hirano et al.

(10) Patent No.: US 11,543,469 B2
(45) Date of Patent: Jan. 3, 2023

(54) CURRENT SENSOR, AND ELECTRIC CONTROL APPARATUS INCLUDING THE CURRENT SENSOR

(71) Applicant: TDK CORPORATION, Tokyo (JP)

(72) Inventors: Hiroyuki Hirano, Tokyo (JP); Makoto Takahashi, Tokyo (JP); Ryoichi Menju, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/517,341

(22) Filed: Nov. 2, 2021

(65) Prior Publication Data

US 2022/0244325 A1 Aug. 4, 2022

(30) Foreign Application Priority Data

Jan. 29, 2021 (JP) ................ JP2021-013902

(51) Int. Cl.
*G01R 33/07* (2006.01)
*G01R 33/09* (2006.01)
*G01R 15/20* (2006.01)

(52) U.S. Cl.
CPC ........... *G01R 33/07* (2013.01); *G01R 15/207* (2013.01); *G01R 33/093* (2013.01)

(58) Field of Classification Search
CPC .... G01R 33/07; G01R 15/207; G01R 33/093; G01R 33/091; G01R 33/0011; G01R 33/072
See application file for complete search history.

(56) References Cited

U.S. PATENT DOCUMENTS

| 6,515,468 | B1 | 2/2003 | Morimoto et al. |
| 7,626,376 | B2 | 12/2009 | Muraki et al. |
| 9,594,130 | B2 | 3/2017 | Kawakami et al. |
| 9,746,499 | B2 | 8/2017 | Chae et al. |
| 2017/0285075 | A1* | 10/2017 | Okuyama ............ G01R 33/093 |
| 2017/0336443 | A1* | 11/2017 | Yokota ................ G01R 15/148 |
| 2018/0321281 | A1* | 11/2018 | Fukuhara ............ G01R 15/207 |

(Continued)

FOREIGN PATENT DOCUMENTS

| JP | H05-81731 A | 4/1993 |
| JP | 2001-66328 A | 3/2001 |

(Continued)

OTHER PUBLICATIONS

Aug. 30, 2022 Office Action issued in Japanese Patent Application No. 2021-013902.

*Primary Examiner* — Alvaro E Fortich
(74) *Attorney, Agent, or Firm* — Oliff PLC

(57) ABSTRACT

A current sensor includes a magnetic detector and a first soft magnetic body. The magnetic detector is configured to be subjected to a magnetic flux that is to be generated when a current flows through a conductor along a first axis direction, the magnetic flux being in a second axis direction. The first soft magnetic body includes a first portion, a second portion disposed between the conductor and the first portion, and a third portion magnetically coupling the first portion and the second portion to each other. The first soft magnetic body is spaced from both of the conductor and the magnetic detector, with the first portion, the second portion, and the third portion surrounding the magnetic detector along a first plane orthogonal to the second axis direction.

19 Claims, 17 Drawing Sheets

(56) References Cited

U.S. PATENT DOCUMENTS

2018/0321283 A1\* 11/2018 Sei .......................... G01R 3/00
2020/0158760 A1\* 5/2020 Fukuhara ............. G01R 15/207

FOREIGN PATENT DOCUMENTS

| JP | 2005-55405 A | 3/2005 |
| JP | 2008-102116 A | 5/2008 |
| JP | 2013-228315 A | 11/2013 |
| JP | 2015-210247 A | 11/2015 |
| JP | 2015-210272 A | 11/2015 |
| JP | 2016-148620 A | 8/2016 |
| JP | 2019-078542 A | 5/2019 |
| JP | 2020-165762 A | 10/2020 |
| WO | 2013/161773 A1 | 10/2013 |

\* cited by examiner

CURRENT SENSOR, AND ELECTRIC CONTROL APPARATUS INCLUDING THE CURRENT SENSOR

CROSS-REFERENCE TO RELATED APPLICATIONS

The present application claims priority from Japanese Patent Application No. 2021-013902 filed on Jan. 29, 2021, the entire contents of which are hereby incorporated by reference.

BACKGROUND

The technology relates to a current sensor, and an electric control apparatus including the current sensor.

Current sensors have been used in vehicles including hybrid electric vehicles (HEVs) and electric vehicles (EVs) to measure an amount of remaining power of a battery, to measure a drive current of a motor, or to serve as an electric control device for a converter or an inverter. Some current sensors are known to include a magnetic sensor including a magnetic detection element configured to detect a magnetic field generated by a current flowing through a conductor such as a bus bar. Such current sensors may include, for example, a magnetoresistive effect element such as an anisotropic magnetoresistive effect (AMR) element, a giant magnetoresistive effect (GMR) element, or a tunneling magnetoresistive effect (TMR) element, or the magnetic detection element such as a Hall element. The current sensors are configured to detect the current flowing through the conductor such as the bus bar in a contactless manner by using the magnetoresistive effect element or the magnetic detection element.

For example, Japanese Unexamined Patent Application Publication (JP-A) No. 2019-078542 discloses a current sensor including a ring-shaped magnetic core having a gap, and a magnetic sensor including a magnetic detection element disposed in the gap. The current sensor disclosed in JP-A No. 2019-078542 is able to concentrate a magnetic flux generated from a conductor onto the magnetic core and to apply the magnetic flux concentrated by the magnetic core to the magnetic detection element disposed in the gap.

SUMMARY

An aspect of the technology provides a current sensor including a magnetic detector and a first soft magnetic body. The magnetic detector is configured to be subjected to a magnetic flux that is to be generated when a current flows through a conductor along a first axis direction, the magnetic flux being in a second axis direction. The first soft magnetic body includes a first portion, a second portion disposed between the conductor and the first portion, and a third portion magnetically coupling the first portion and the second portion to each other. The first soft magnetic body is spaced from both of the conductor and the magnetic detector, with the first portion, the second portion, and the third portion surrounding the magnetic detector along a first plane orthogonal to the second axis direction.

An aspect of the technology provides a current sensor including a conductor, a magnetic detector, a first soft magnetic body, and a second soft magnetic body. The conductor includes a first conductor portion and a second conductor portion each extending in a first axis direction. The first conductor portion is configured to generate a first magnetic flux in a second axis direction when a current flows therethrough in a first direction. The second conductor portion is configured to generate a second magnetic flux in the second axis direction when the current flows therethrough in a second direction opposite to the first direction. The magnetic detector is configured to be subjected to the first magnetic flux and the second magnetic flux. The first soft magnetic body includes a first portion, a second portion, and a third portion. The second portion is opposed to the first portion in the first axis direction. The third portion magnetically couples the first portion and the second portion to each other. The first soft magnetic body is spaced from both of the conductor and the magnetic detector, with the first portion, the second portion, and the third portion surrounding the magnetic detector along a first plane orthogonal to the second axis direction. The second soft magnetic body surrounds the magnetic detector, the first conductor portion, and the second conductor portion along a third plane orthogonal to the first axis direction.

An aspect of the technology provides an electric control apparatus including the current sensor according to one of the aspects of the technology or the current sensor according to another one of the aspects of the technology.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
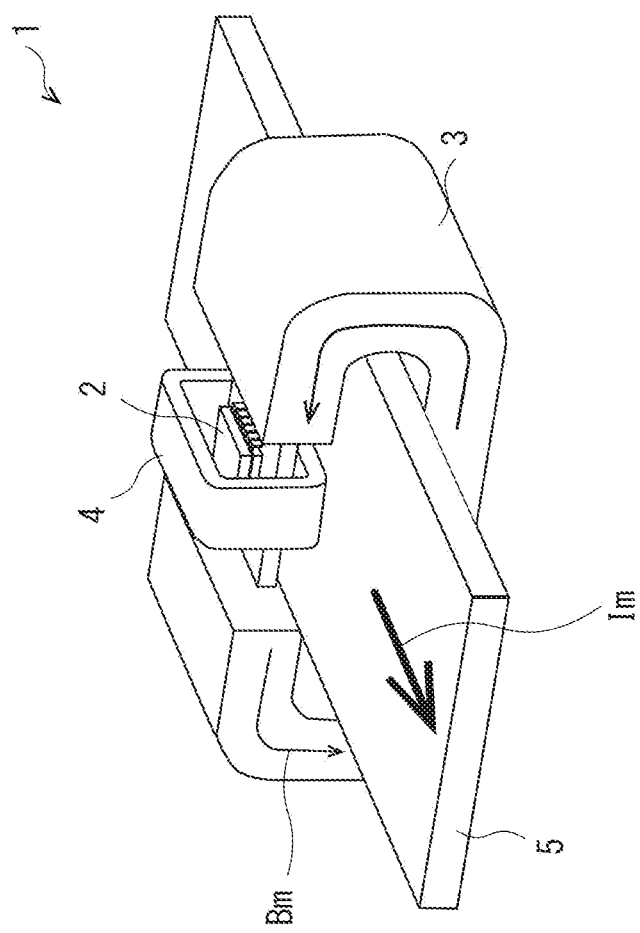
FIG. 1 is a perspective diagram illustrating an overall configuration example of a current sensor according to one example embodiment of the technology.

What is expected of a current sensor including a magnetic sensor is that its measurement accuracy be less affected by a disturbance magnetic field.

It is desirable to provide a current sensor that is less susceptible to a disturbance magnetic field and is able to detect a current with high accuracy, and an electric control apparatus including such a current sensor.

In the following, some example embodiments and modification examples of the technology will be described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

0. Background
1. First Example Embodiment
   An example of a current sensor disposed near a conductor.
2. Second Example Embodiment
   An example of a current sensor disposed near a conductor.
3. Third Example Embodiment
   An example of an electric control apparatus including a current sensor.

0. Background

In the current sensor disclosed in JP-A No. 2019-078542 described above, a magnetic field generated from the conductor is high in intensity, thus making it easier for the magnetic core to become magnetically saturated. As a result, output linearity of the magnetic sensor can suffer degradation. The degradation in the output linearity of the magnetic sensor may be improved by widening the gap of the magnetic core or by increasing the magnetic core in volume. However, widening the gap of the magnetic core can cause a magnetic detector to be subjected more easily to a magnetic field other than the magnetic field generated from the conductor, resulting in degradation in accuracy of detection by the current sensor. Hereinafter, a magnetic field other than the magnetic field generated from the conductor may be referred to as a "disturbance magnetic field".

Applicant provides a current sensor and an electric control apparatus that each make it possible to reduce an influence of a disturbance magnetic field on a magnetic detector and to achieve high measurement accuracy.

First Example Embodiment

[Configuration of Current Sensor 1]

Figure 2A:
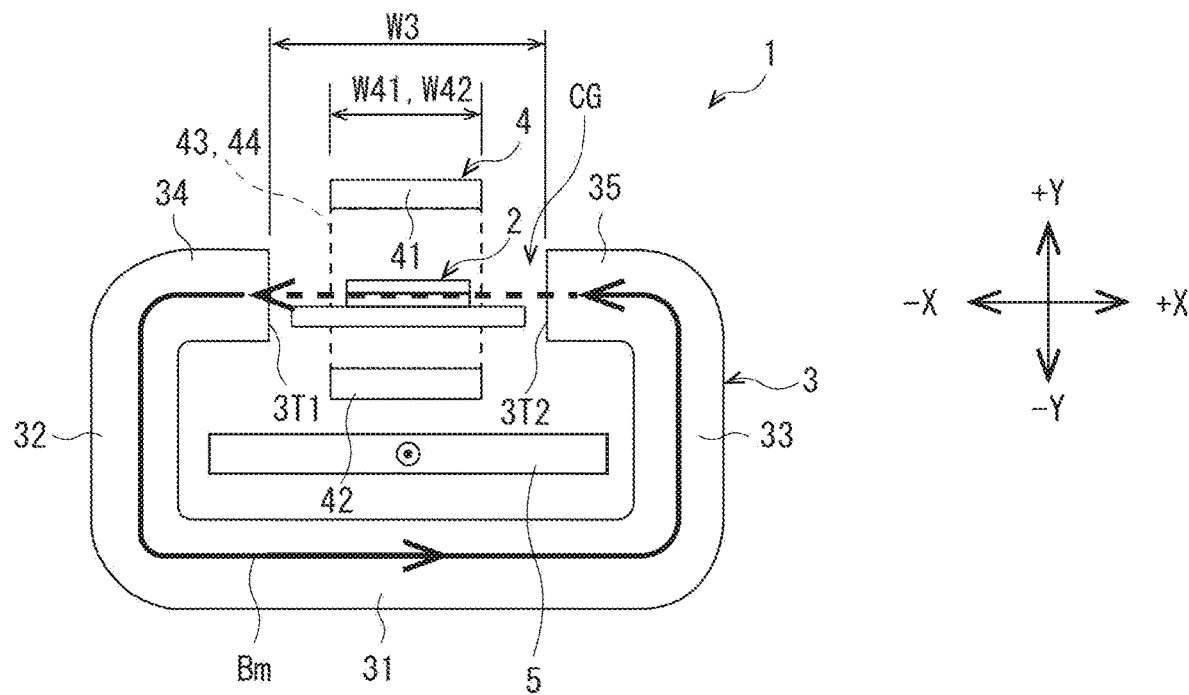
FIG. 2A is a schematic cross-sectional view of the current sensor illustrated in FIG. 1.
Figure 2B:
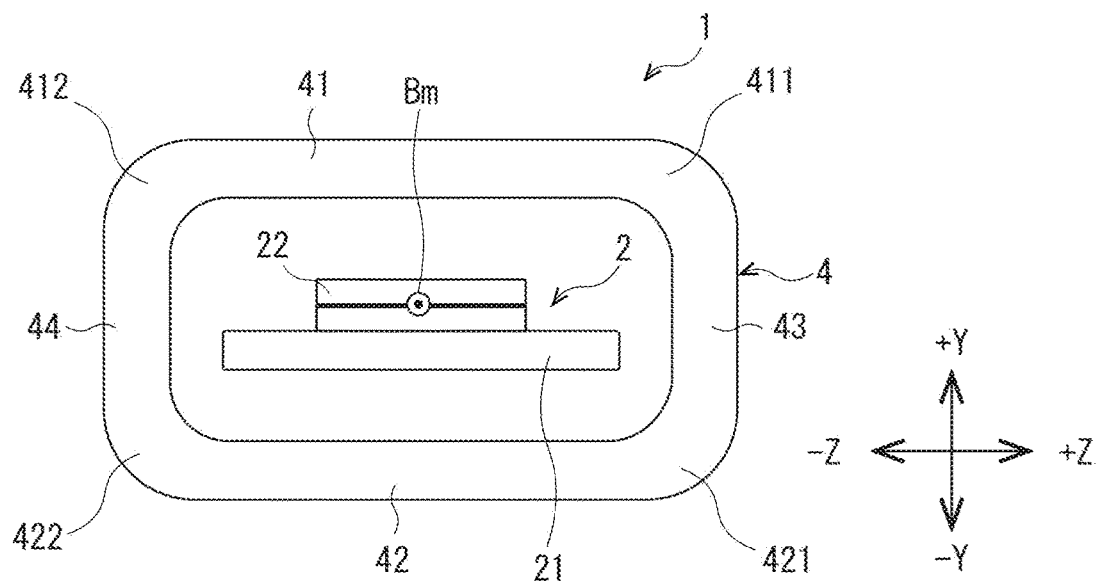
FIG. 2B is an enlarged schematic view of a portion of the current sensor illustrated in FIG. 1.

First, with reference to FIGS. 1 to 6, a description will be given of a configuration of a current sensor 1 according to a first example embodiment of the technology. FIG. 1 is a perspective diagram illustrating an overall configuration example of the current sensor 1. Referring to FIG. 1, the current sensor 1 includes, for example, a magnetic detector 2, a flux concentrating core 3, and a magnetic shield 4. The current sensor 1 may be disposed near a conductor 5, for example. The conductor 5 may extend in a Z-axis direction, for example. A current Im to be detected by the current sensor 1 is to flow through the conductor 5 along the Z-axis direction. FIG. 2A is a schematic cross-sectional view of the current sensor 1 in an XY plane orthogonal to the Z-axis direction. FIG. 2B is an enlarged schematic cross-sectional view of the magnetic detector 2 and the magnetic shield 4 in a YZ plane in the current sensor 1. In the current sensor 1, when the current Im flows through the conductor 5 in a +Z direction along the Z-axis direction, a magnetic flux Bm is induced around the conductor 5. The magnetic flux Bm passes through the inside of the flux concentrating core 3, for example. The magnetic flux Bm is applied to the magnetic detector 2 in a −X direction along an X-axis direction, for example. In other words, the magnetic detector 2 may be so disposed as to allow the magnetic flux Bm to pass therethrough in the −X direction. In the present example embodiment, a direction along the width (hereinafter, "width direction") of the conductor 5 is the X-axis direction, and a direction along the thickness (hereinafter, "thickness direction") of the conductor 5 is a Y-axis direction. The Z-axis direction may correspond to a specific but non-limiting example of a "first axis direction" according to one embodiment of the technology. The X-axis direction may correspond to a specific but non-limiting example of a "second axis direction" according to one embodiment of the technology. The Y-axis direction may correspond to a specific but non-limiting example of a "third axis direction" according to one embodiment of the technology.

[Conductor 5]

The conductor 5 may include, for example, a highly electrically-conductive nonmagnetic material such as copper (Cu). The conductor 5 may be a generally plate-shaped body having a length extending in the Z-axis direction and the thickness in the Y-axis direction, for example. The conductor 5 may extend through a space surrounded by the flux concentrating core 3 shaped roughly like a doughnut.

[Flux Concentrating Core 3]

The flux concentrating core 3 may be a soft magnetic body that concentrates the magnetic flux Bm to allow the magnetic flux Bm to pass therethrough. As illustrated in FIG. 2A, the flux concentrating core 3 may be provided to surround the conductor 5 along the XY plane orthogonal to the Z-axis direction, for example. Note that "to surround the conductor 5" conceptually encompasses not only a configuration in which the flux concentrating core 3 extends fully around the conductor 5 into a doughnut-like shape but also a configuration in which the flux concentrating core 3 extends partially around the conductor 5 into a partly cutaway doughnut-like shape. The flux concentrating core 3 may include a first core part 31, a second core part 32, a third core part 33, a fourth core part 34, and a fifth core part 35. The first core part 31, the fourth core part 34, and the fifth core part 35 may each extend, for example, in the X-axis direction, i.e., in the width direction of the conductor 5. The second core part 32 and the third core part 33 may each extend, for example, in the Y-axis direction, i.e., in the thickness direction of the conductor 5. The first core part 31 may be opposed to the fourth core part 34 and the fifth core part 35 in the Y-axis direction. The second core part 32 and the third core part 33 may be opposed to each other in the X-axis direction. The second core part 32 may be provided to couple a first end in the X-axis direction of the first core part 31 and a first end in the X-axis direction of the fourth core part 34 to each other. The fourth core part 34 may have an end face 3T1 at a second end in the X-axis direction thereof opposite to the first end in the X-axis direction thereof. The third core part 33 may be provided to couple a second end in the X-axis direction of the first core part 31, which is opposite to the first end in the X-axis direction thereof, and a first end in the X-axis direction of the fifth core part 35 to each other. The fifth core part 35 may have an end face 3T2 at a second end in the X-axis direction thereof opposite to the first end in the X-axis direction thereof. The end face 3T1 and the end face 3T2 may be spaced from and opposed to each other. A space defined between the end faces 3T1 and 3T2 may constitute a core gap CG. The core gap CG may have a width W3 in the X-axis direction. FIG. 2A illustrates an example case where the first core part 31, the second core part 32, the third core part 33, the fourth core part 34, and the fifth core part 35 are so coupled as to be each physically in contact with one or more adjacent ones of the core parts 31 to 35; however, embodiments of the technology are not limited to such an example. For example, the first core part 31, the second core part 32, the third core part 33, the fourth core part 34, and the fifth core part 35 only have to be magnetically coupled to each other, and do not necessarily have to be each physically in contact with the adjacent ones of the core parts 31 to 35.

In the flux concentrating core 3 illustrated in FIG. 2A, a coupling portion between the first core part 31 and the second core part 32, a coupling portion between the first core part 31 and the third core part 33, a coupling portion between the second core part 32 and the fourth core part 34, and a coupling portion between the third core part 33 and the fifth core part 35 may each have a curved shape. However, embodiments of the technology are not limited to such an example. For example, these coupling portions may each have a bent shape or a shape with chamfered edges.

The flux concentrating core 3 may correspond to a specific but non-limiting example of a "second soft magnetic body" according to one embodiment of the technology. The XY plane may correspond to a specific but non-limiting example of a "third plane" according to one embodiment of the technology.

[Magnetic Detector 2]

The magnetic detector 2 may be disposed, for example, in the core gap CG, i.e., the space between the end face 3T1 and the end face 3T2. In the current sensor 1, the magnetic flux Bm is generated from the conductor 5 when the current Im flows through the conductor 5, and the generated magnetic flux Bm is concentrated onto the flux concentrating core 3 having the core gap CG. The entire flux concentrating core 3 may constitute a path of the magnetic flux Bm, that is, a magnetic path. The magnetic detector 2 provided in the core gap CG is thus disposed in the magnetic path or the path of the magnetic flux to be concentrated onto the flux concentrating core 3. In the present example embodiment, the magnetic detector 2 being provided in the core gap CG thus means that only at least part of the magnetic detector 2 has to be located in the magnetic path of the magnetic flux Bm. In other words, the entire magnetic detector 2 may be located in the core gap CG or only a portion of the magnetic detector 2 may be located in the core gap CG. Details of a configuration of the magnetic detector 2 will be described later.

[Magnetic Shield 4]

The magnetic shield 4 may be a member that magnetically shields the magnetic detector 2 from a disturbance magnetic field. In other words, the magnetic shield 4 may be a soft magnetic body that mitigates an influence of an unwanted magnetic field (magnetic flux) from the outside, which is other than the magnetic flux Bm to be detected, on the magnetic detector 2. As illustrated in FIG. 2B, the magnetic shield 4 surrounds the magnetic detector 2 along the YZ plane orthogonal to the X-axis direction, thus having a doughnut-like shape as a whole. Note that "surround the magnetic detector 2" conceptually encompasses not only a configuration in which the magnetic shield 4 extends fully around the magnetic detector 2 into a doughnut-like shape but also a configuration in which the magnetic shield 4 extends partially around the magnetic detector 2 into a partly cutaway doughnut-like shape. The magnetic shield 4 may be spaced from both of the conductor 5 and the magnetic detector 2, being physically in contact with neither of the conductor 5 and the magnetic detector 2.

The magnetic shield 4 may include, for example, a first shield part 41, a second shield part 42, a third shield part 43, and a fourth shield part 44. The first shield part 41 and the second shield part 42 may each extend along an XZ plane including the Z-axis direction and the X-axis direction. The third shield part 43 and the fourth shield part 44 may each extend, for example, in the Y-axis direction, i.e., in the thickness direction of the conductor 5. The first shield part 41 and the second shield part 42 may be opposed to each other in the Y-axis direction. The first shield part 41 may be disposed on a side opposite to the conductor 5 in the Y-axis direction as viewed from the core gap CG, for example. The second shield part 42 may be disposed between the conductor 5 and the first shield part 41. The second shield part 42 may be present between, for example, the core gap CG and the conductor 5 in the Y-axis direction. Further, the magnetic detector 2 may be disposed to overlap both of the first shield part 41 and the second shield part 42 as viewed in the Y-axis direction orthogonal to the XZ plane. The third shield part 43 and the fourth shield part 44 may be opposed to each other in the Z-axis direction. The third shield part 43 may be provided to magnetically couple a first end 411 in the Z-axis direction of the first shield part 41 and a first end 421 in the Z-axis direction of the second shield part 42 to each other. The fourth shield part 44 may be provided to magnetically couple a second end 412 in the Z-axis direction of the first shield part 41, which is opposite to the first end 411, and a second end 422 in the Z-axis direction of the second shield part 42, which is opposite to the first end 421, to each other. FIG. 2B illustrates an example case where the first shield part 41, the second shield part 42, the third shield part 43, and the fourth shield part 44 are so coupled as to be each physically in contact with adjacent ones of the shield parts 41 to 44; however, embodiments of the technology are not limited to such an example. For example, the first shield part 41, the second shield part 42, the third shield part 43, and the fourth shield part 44 only have to be in a state of being magnetically coupled to each other, and do not necessarily have to be each physically in contact with the adjacent ones of the shield parts 41 to 44. Here, the state of being magnetically coupled refers to a state in which two adjacent shield parts are disposed in such proximity to each other as to be at a distance of, for example, 0.05 mm or less from each other. If two shield parts to be magnetically coupled to each other are disposed at a distance of, for example, 0.1 mm or more from each other, the two shield parts will be magnetically separated from each other to cause a reduction in magnetic shield effect.

In the example of FIG. 2A, a width W41 of the first shield part 41 and a width W42 of the second shield part 42 may be substantially equal. The widths W41 and W42 are respective dimensions of the first shield part 41 and the second shield part 42 in the X-axis direction. The widths W41 and W42 may each be smaller than, for example, the width W3 of the core gap CG of the flux concentrating core 3 (i.e., W41 <W3, and W42<W3). Note that the widths W41 and W42 may each be set to, for example, a range from 2 mm to 10 mm, both inclusive, and the width W3 may be set to, for example, a range from 4 mm to 12 mm, both inclusive.

In the magnetic shield 4 illustrated in FIG. 2B, a coupling portion between the first shield part 41 and the third shield part 43, a coupling portion between the third shield part 43 and the second shield part 42, a coupling portion between the second shield part 42 and the fourth shield part 44, and a coupling portion between the fourth shield part 44 and the first shield part 41 may each have a curved shape. However, embodiments of the technology are not limited to such an example. For example, these coupling portions may each have a bent shape or a shape with chamfered edges.

The magnetic shield 4 may correspond to a specific but non-limiting example of a "first soft magnetic body" according to one embodiment of the technology. The YZ plane may correspond to a specific but non-limiting example of a "first plane" according to one embodiment of the technology. The XZ plane may correspond to a specific but non-limiting example of a "second plane" according to one embodiment of the technology.

The flux concentrating core 3 and the magnetic shield 4 may each include, for example, a soft magnetic material such as silicon steel, electromagnetic steel, pure iron (SUY), or permalloy, as a main constituent material. It is easier for the flux concentrating core 3 to be magnetized by application of the magnetic flux Bm than for the magnetic shield 4. Therefore, in one example, a material that is relatively low in residual magnetization, such as FeSi or permalloy, may be used for the flux concentrating core 3. In contrast, it is harder for the magnetic shield 4 to be magnetized with the magnetic flux Bm than for the flux concentrating core 3. Therefore, a material that is relatively high in residual magnetization, such as pure iron, is usable for the magnetic shield 4.

In one example, the constituent material of the magnetic shield 4 may be higher in core loss than the constituent material of the flux concentrating core 3. The magnetic flux Bm generated from the conductor 5 upon flowing of a predetermined current Im through the conductor 5 flows through the flux concentrating core 3 and the magnetic shield 4. As the current Im flowing through the conductor 5 increases in frequency, a frequency response of the magnetic shield 4 including a relatively high core loss material becomes lower, causing a relative reduction in the magnetic flux Bm flowing through the magnetic shield 4. As the current Im increases in frequency, a frequency response of the flux concentrating core 3 including a relatively low core loss material also becomes lower, making it harder for the magnetic flux Bm to flow therethrough. However, because of the relative reduction in the magnetic flux Bm flowing through the magnetic shield 4, the magnetic flux Bm flowing through the flux concentrating core 3 relatively increases. This is considered to result in better stabilization of a magnetic flux density of the magnetic flux Bm to be applied to the magnetic detector 2 than in a case where the current sensor 1 does not include the magnetic shield 4. As a difference between the core loss of the constituent material of the magnetic shield 4 and the core loss of the constituent material of the flux concentrating core 3 increases, the frequency response is improved to make it possible to suppress attenuation of the magnetic flux density of the magnetic flux Bm to be applied to the magnetic detector 2. As a result, it is possible to stabilize a response characteristic of the current sensor 1 to an alternating current. In one example, the difference between the core loss of the constituent material of the magnetic shield 4 and the core loss of the constituent material of the flux concentrating core 3 may be 2.0 W/kg or more. In a more specific but non-limiting example, the difference may be in a range from 4.5 W/kg to 10.0 W/kg, both inclusive. The core loss may be determined, in accordance with the Epstein test method based on JIS-C-2550, as a magnitude of core loss per unit weight (an average of magnitudes in a rolling direction and a direction perpendicular thereto) upon sinusoidal excitation where a maximum magnetic flux density is 1.5 T at a frequency of 50 Hz. Note that the constituent material of the flux concentrating core 3 may be the same kind of material as that of the magnetic shield 4, or may be a different kind of material from that of the magnetic shield 4. For example, both the flux concentrating core 3 and the magnetic shield 4 may include electromagnetic steel, and in such a case, the electromagnetic steel included in the magnetic shield 4 may be higher in core loss than the electromagnetic steel included in the flux concentrating core 3.

Figure 3:
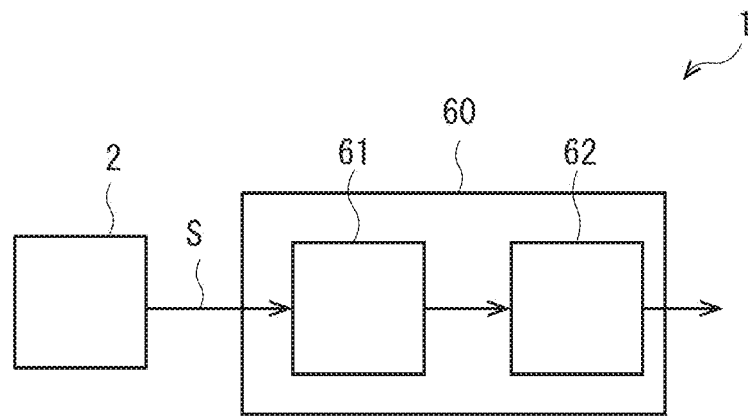
FIG. 3 is a block diagram illustrating a schematic configuration of the current sensor illustrated in FIG. 1.

FIG. 3 is a block diagram illustrating a schematic configuration of the current sensor 1. Referring to FIG. 3, the current sensor 1 may include a signal processor 60 as well as the magnetic detector 2. The signal processor 60 may include, for example, an analog-to-digital (A/D) converter 61 and a calculator 62. The A/D converter 61 may convert an analog signal outputted from the magnetic detector 2 into a digital signal. The calculator 62 may perform arithmetic processing on the digital signal resulting from digital conversion by the A/D converter 61. Note that the signal processor 60 may further include a digital-to-analog (D/A) converter downstream of the calculator 62. With the D/A converter, the signal processor 60 is able to output a result of the arithmetic processing performed by the calculator 62 as an analog signal.

Figure 4:
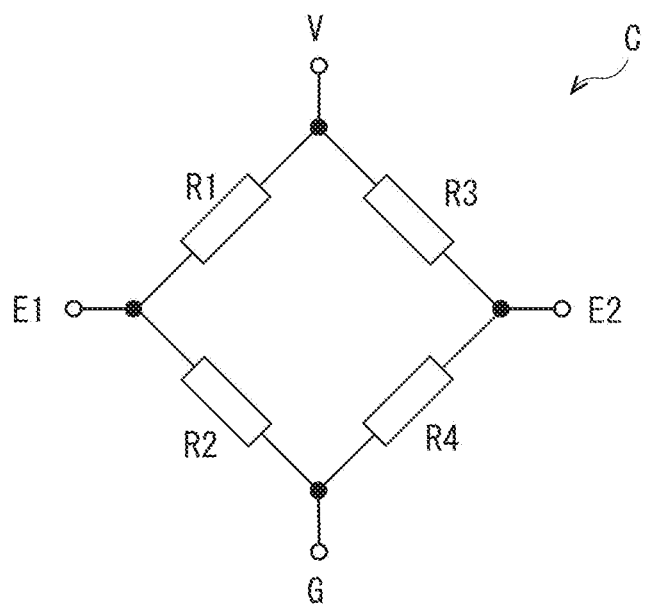
FIG. 4 is a circuit diagram schematically illustrating a circuit configuration of a magnetic detector illustrated in FIG. 1.

FIG. 4 is a circuit diagram schematically illustrating a circuit configuration of the magnetic detector 2 illustrated in FIG. 1. As illustrated in FIG. 4, the magnetic detector 2 may include, for example, a Wheatstone bridge circuit C including a first resistor R1, a second resistor R2, a third resistor R3, and a fourth resistor R4 that are coupled in a bridge configuration. However, the magnetic detector 2 may include a circuit in which two resistors, i.e., the first resistor R1 and the second resistor R2, are coupled in a half bridge configuration. The first to fourth resistors R1 to R4 may each include a single magnetoresistive effect (MR) element or a single Hall element, or may each include a plurality of MR elements or a plurality of Hall elements. Examples of the MR element include an anisotropic magnetoresistive effect (AMR) element, a giant magnetoresistive effect (GMR) element, and a tunneling magnetoresistive effect (TMR) element.

The Wheatstone bridge circuit C in the magnetic detector 2 may include: a power supply port V; a ground port G; two output ports E1 and E2; the first resistor R1 and the second resistor R2 coupled in series to each other; and the third resistor R3 and the fourth resistor R4 coupled in series to each other. A first end of each of the first resistor R1 and the third resistor R3 may be coupled to the power supply port V. A second end of the first resistor R1 may be coupled to a first end of the second resistor R2 and the output port E1. A second end of the third resistor R3 may be coupled to a first end of the fourth resistor R4 and the output port E2. A second end of each of the second resistor R2 and the fourth resistor R4 may be coupled to the ground port G. The power supply port V may receive a power supply voltage of a predetermined magnitude. The ground port G may be coupled to a ground.

Figure 5:
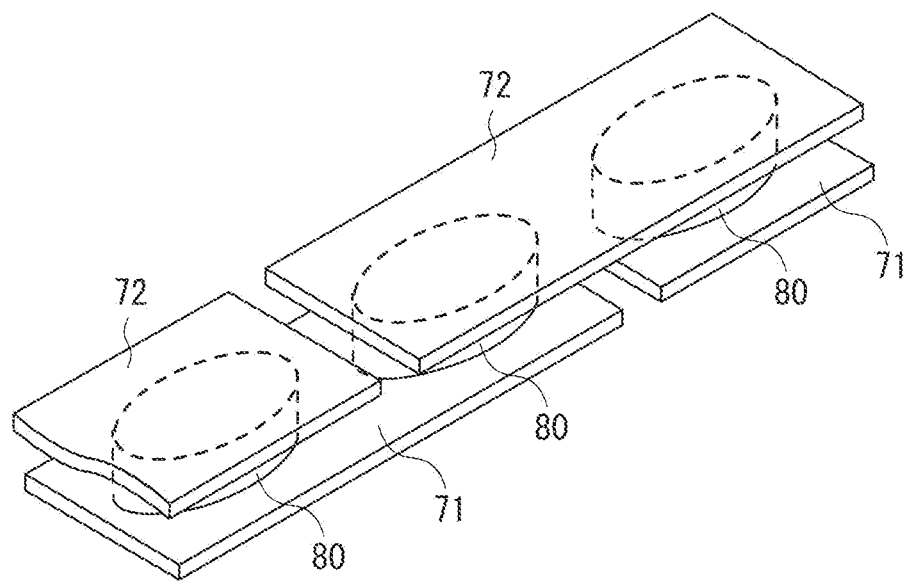
FIG. 5 is a perspective diagram illustrating a schematic configuration example of a magnetoresistive effect element included in the magnetic detector illustrated in FIG. 1.
Figure 6:
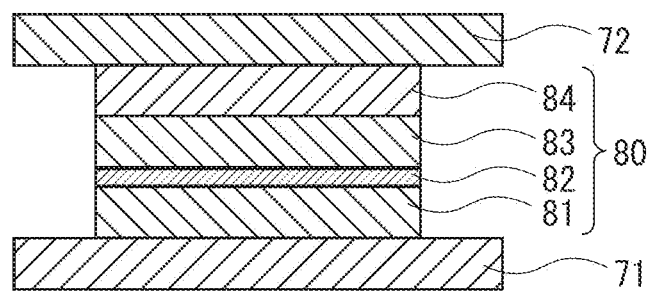
FIG. 6 is a schematic cross-sectional diagram illustrating a cross-sectional configuration example of the magnetoresistive effect element illustrated in FIG. 5.

FIG. 5 is a perspective diagram illustrating a schematic configuration example of the MR element, such as the GMR element or the TMR element, included in each of the first to fourth resistors R1 to R4 illustrated in FIG. 4. As illustrated in FIG. 5, the MR element included in each of the first to fourth resistors R1 to R4 may include a plurality of first electrodes 71, a plurality of MR films 80, and a plurality of second electrodes 72, for example. The first electrodes 71 may be disposed on a substrate, for example. The first electrodes 71 may also be referred to as lower lead electrodes. The first electrodes 71 may each have a long slender shape. Every two first electrodes 71 adjacent to each other in the longitudinal direction thereof may have a gap therebetween. The MR films 80 may be provided on a top surface of each first electrode 71 at positions near opposite ends of the first electrode 71 in the longitudinal direction thereof. FIG. 6 is a schematic cross-sectional diagram illustrating a cross-sectional configuration example of the MR element illustrated in FIG. 5 that is included in each of the first to fourth resistors R1 to R4. The MR film 80 may have a generally circular shape in a plan view. As illustrated in FIG. 6, the MR film 80 may include a free layer 81, a nonmagnetic layer 82, a magnetization pinned layer 83, and an antiferromagnetic layer 84 that are staked in this order from the first electrode 71 side. The free layer 81 may be electrically coupled to the first electrode 71. The antiferromagnetic layer 84 includes an antiferromagnetic material. The antiferromagnetic layer 84 may play a role of establishing exchange coupling with the magnetization pinned layer 83 and thereby pinning the magnetization direction of the magnetization pinned layer 83. The second electrodes 72 may be disposed on the MR films 80. The second electrodes 72 may each have a long slender shape, and may electrically couple the respective antiferromagnetic layers 84 of two adjacent MR films 80 that are disposed on two first electrodes 71 adjacent to each other in the longitudinal direction of the first electrodes 71. The second electrodes 72 may also be referred to as upper lead electrodes. Note that the MR film 80 may have a configuration in which the free layer 81, the nonmagnetic layer 82, the magnetization pinned layer 83, and the antiferromagnetic layer 84 are staked in this order from the second electrode 72 side. Alternatively, the antiferromagnetic layer 84 may be omitted by configuring the magnetization pinned layer 83 as a pinned layer of a so-called self-pinned type, that is, a so-called synthetic ferri-pinned (SFP) layer having a stacked ferrimagnetic structure including a stack of a ferromagnetic layer/a nonmagnetic intermediate layer/a ferromagnetic layer in which the two ferromagnetic layers are antiferromagnetically coupled to each other.

In the TMR element, the nonmagnetic layer 82 is a tunnel barrier layer. In the GMR element, the nonmagnetic layer 82 is a nonmagnetic electrically-conductive layer. The TMR element and the GMR element each change in resistance in accordance with an angle that the magnetization direction of the free layer 81 forms with respect to the magnetization direction of the magnetization pinned layer 83. The resistance is at a minimum value when the foregoing angle is 0°, that is, when the respective magnetization directions of the free layer 81 and the magnetization pinned layer 83 are parallel to each other, and at a maximum value when the foregoing angle is 180°, that is, when the respective magnetization directions of the free layer 81 and the magnetization pinned layer 83 are antiparallel to each other.

In a case where the first to fourth resistors R1 to R4 each include the TMR element or the GMR element, in the Wheatstone bridge circuit C in the magnetic detector 2, the magnetization direction of the magnetization pinned layer 83 in the first resistor R1 and that of the magnetization pinned layer 83 in the second resistor R2 are parallel to the X-axis direction and are antiparallel to each other. Further, the magnetization direction of the magnetization pinned layer 83 in the third resistor R3 and that of the magnetization pinned layer 83 in the fourth resistor R4 are parallel to the X-axis direction and are antiparallel to each other. In the magnetic detector 2, a potential difference between the output ports E1 and E2 changes in response to a change in intensity of a magnetic field in the X-axis direction generated from the conductor 5, and a signal corresponding to the potential difference between the output ports E1 and E2 is outputted to the signal processor 60 as a sensor signal S. In one example, the signal corresponding to the potential difference between the output ports E1 and E2 may be amplified by a difference detector, and the amplified signal may be outputted as the sensor signal S to the A/D converter 61 of the signal processor 60.

The A/D converter 61 may convert the sensor signal S (an analog signal related to the current) outputted from the magnetic detector 2 into a digital signal, and the calculator 62 may receive the digital signal. The calculator 62 may perform arithmetic processing on the digital signal resulting from the conversion of the analog signal by the A/D converter 61. The calculator 62 may include, for example, without limitation, a microcomputer or an application-specific integrated circuit (ASIC).

[Example Workings and Effects of Current Sensor 1]

Figure 7:
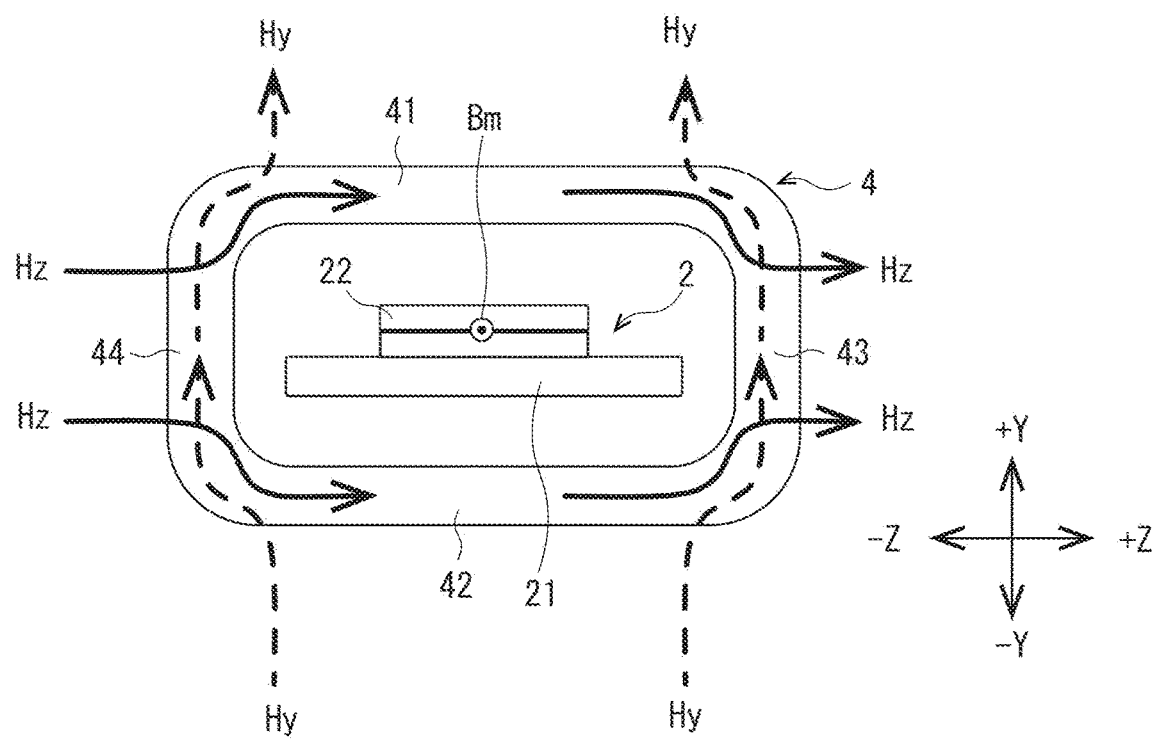
FIG. 7 is a first explanatory diagram for describing example workings and effects of the current sensor illustrated in FIG. 1.

According to the current sensor 1 of the present example embodiment, the magnetic shield 4 is provided to surround the magnetic detector 2 disposed in the core gap CG of the flux concentrating core 3. This mitigates an influence of a magnetic flux of an unwanted disturbance magnetic field from surroundings on the magnetic detector 2. For example, a magnetic field component Hy and a magnetic field component Hz of the disturbance magnetic field, which are respectively along the Y-axis direction and the Z-axis direction, mainly pass through the magnetic shield 4, as illustrated in FIG. 7, for example. As a result, the magnetic field components Hy and Hz passing through the magnetic detector 2 disposed in the space surrounded by the magnetic shield 4 are reduced. Note that FIG. 7 is a first explanatory diagram for describing example workings and effects of the current sensor 1. For example, the magnetic field component Hz is split into two respective flows that pass through the first shield part 41 and the second shield part 42 opposed to each other in the Y-axis direction and extending along the XZ plane. The magnetic field component Hy is also split into two respective flows that pass through the third shield part 43 and the fourth shield part 44 opposed to each other in the Z-axis direction and extending in the XY plane. In FIG. 7, a path of the magnetic field component Hz is schematically illustrated in a solid arrow, and a path of the magnetic field component Hy is schematically illustrated in a dashed arrow.

Figure 8:
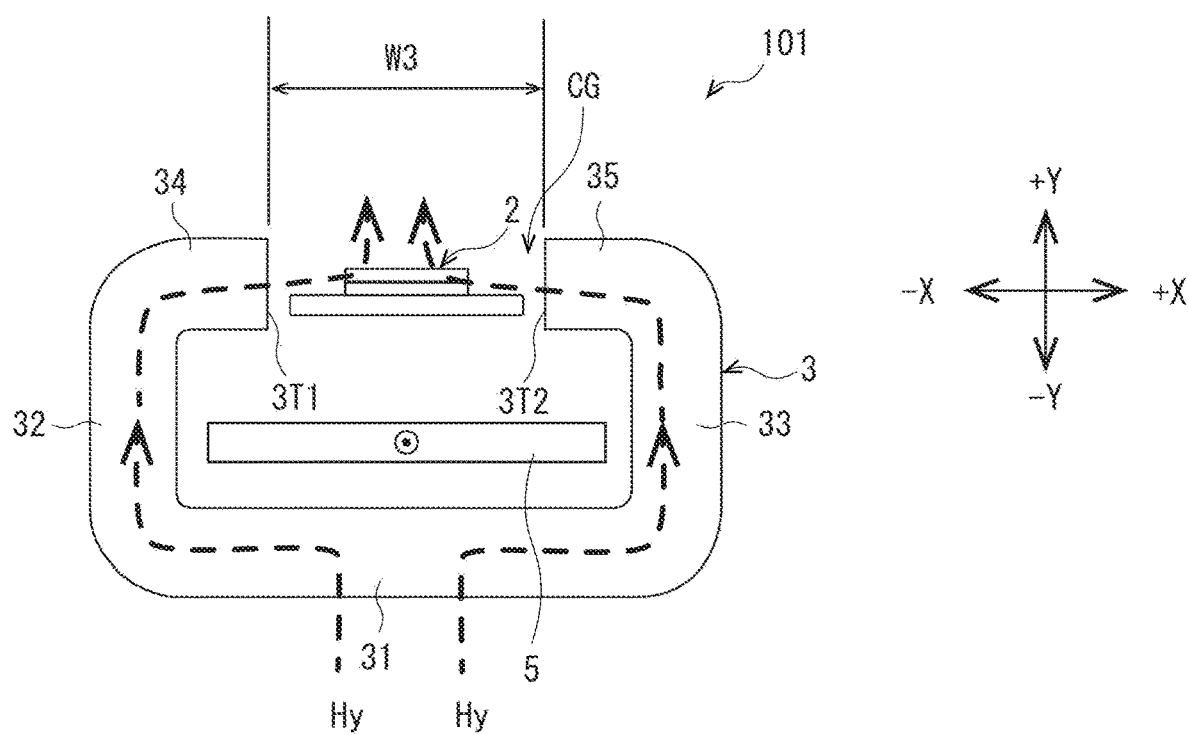
FIG. 8 is an explanatory diagram for describing a behavior of a current sensor according to a reference example.

FIG. 8 illustrates a reference example of a current sensor 101 without the magnetic shield 4. In this case, the magnetic field component Hy flows toward the magnetic detector 2 intensively after passing through the flux concentrating core 3.

Note that the current sensor 101 has a configuration substantially the same as that of the current sensor 1 except that the magnetic shield 4 is omitted.

Figure 9:
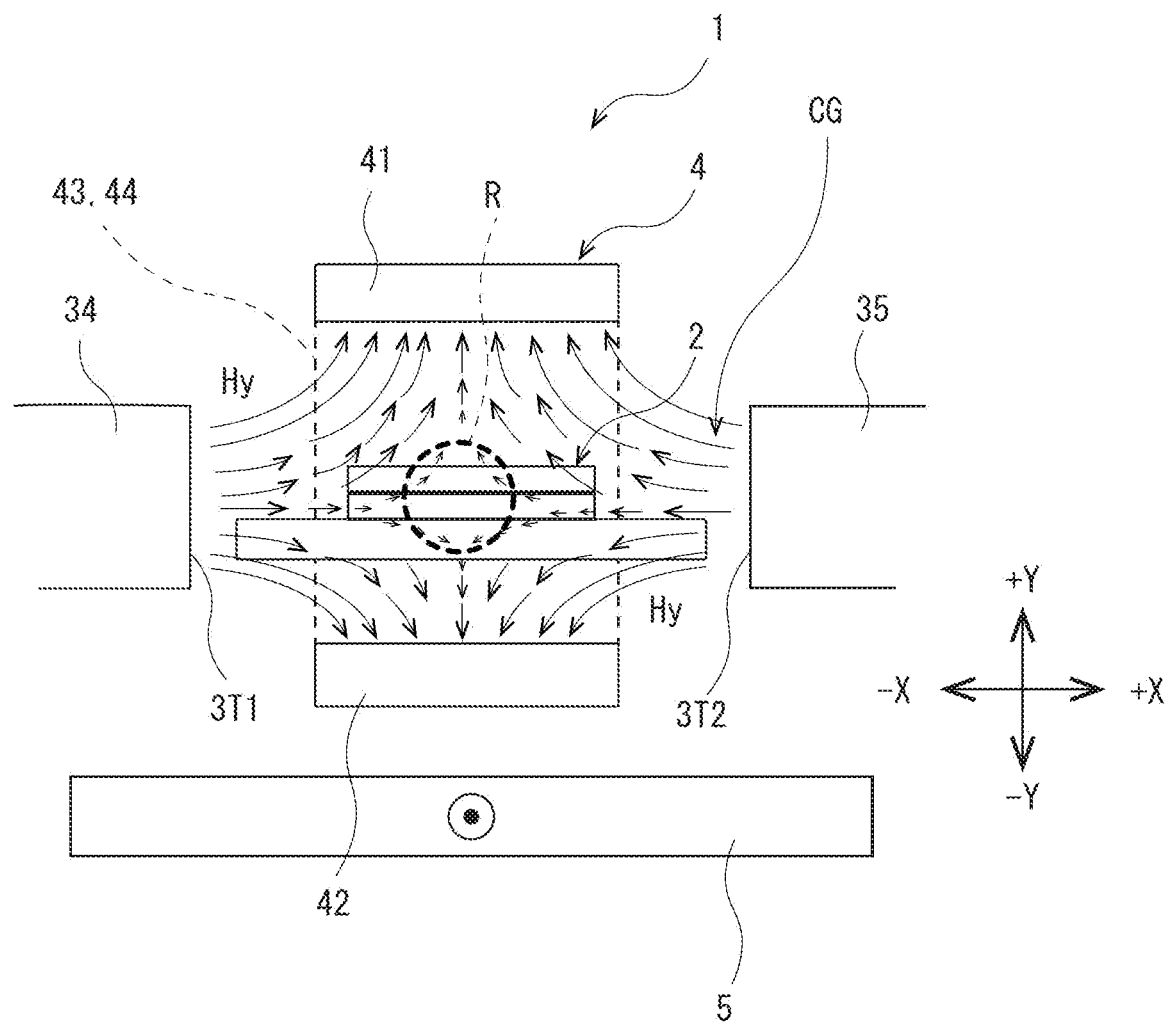
FIG. 9 is a second explanatory diagram for describing the example workings and effects of the current sensor illustrated in FIG. 1.

In contrast, in the current sensor 1 according to the present example embodiment, as illustrated in FIG. 9, for example, the magnetic field component Hy having flown into the flux concentrating core 3 and flown out thereof through each of the end faces 3T1 and 3T2 is split into two respective flows to flow into the first shield part 41 and the second shield part 42. As a result, a magnetic field component Hy in a +Y direction and a magnetic field component Hy in a −Y direction cancel each other out, thereby generating a region R where the magnetic field component Hy is substantially absent. Thus, disposing the first to fourth resistors R1 to R4 of the magnetic detector 2 in the region R makes it possible to reduce the influence of the magnetic field component Hy on the magnetic detector 2. Note that FIG. 9 is a second explanatory diagram for describing the example workings and effects of the current sensor 1.

Figure 10:
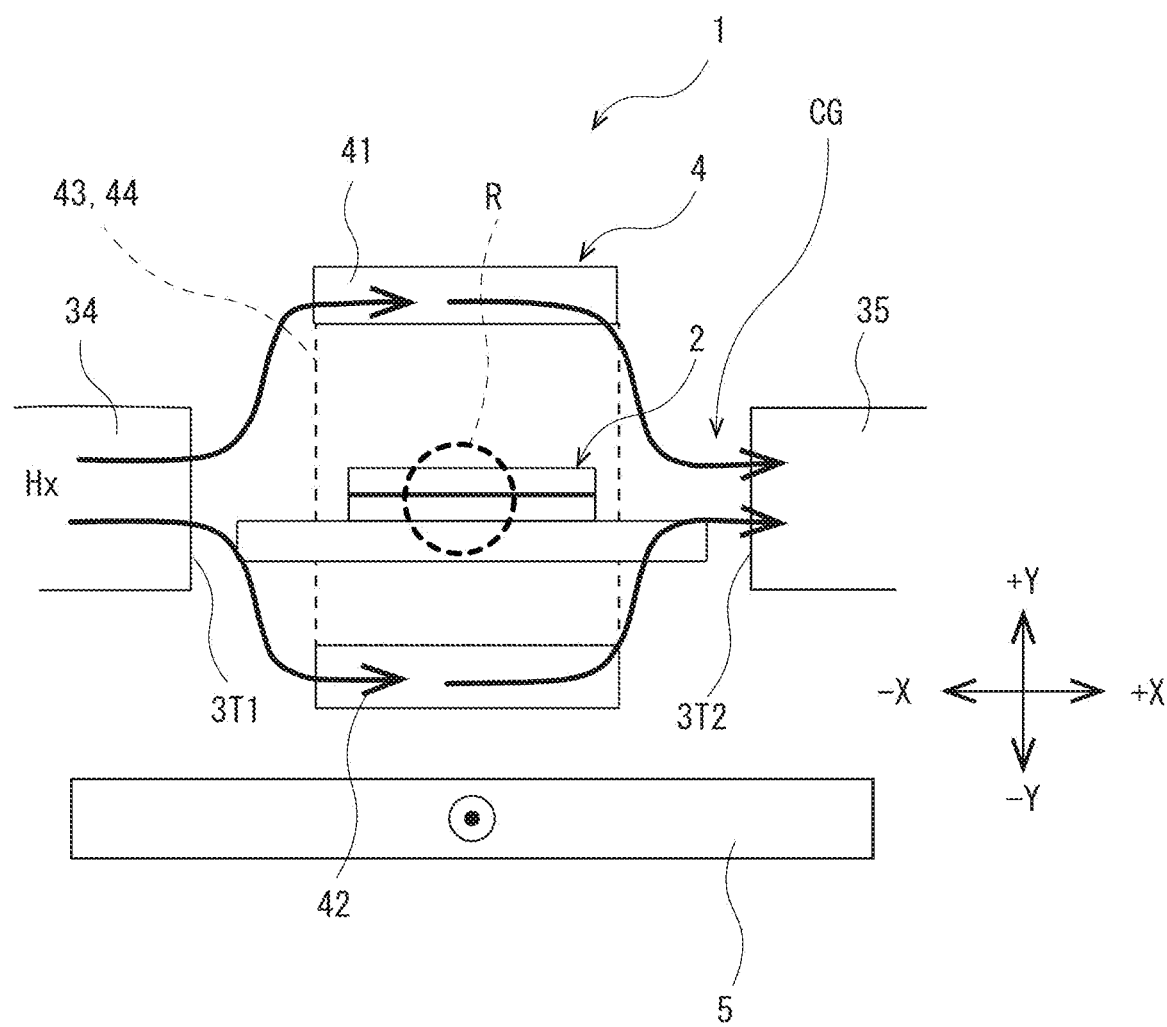
FIG. 10 is a third explanatory diagram for describing the example workings and effects of the current sensor illustrated in FIG. 1.

The current sensor 1 also helps to prevent the magnetic field component Hx along the X-axis direction of the disturbance magnetic field from reaching the magnetic detector 2. A reason for this is that, as illustrated in FIG. 10, the magnetic field component Hx is split into two respective flows to flow into the first shield part 41 and the second shield part 42 of the magnetic shield 4 through the respective first ends in the width direction of the first shield part 41 and the second shield part 42, and to flow out of the first shield part 41 and the second shield part 42 through their respective second ends in the width direction. Note that FIG. 10 is a third explanatory diagram for describing the example workings and effects of the current sensor 1.

In the current sensor 1 and the current sensor 101, an increase in the current Im flowing through the conductor 5 make it easier for the flux concentrating core 3 to become magnetically saturated. This can degrade the output linearity of the magnetic detector 2, thus hindering accurate measurement of a value of the current to be detected. To avoid this, the flux concentrating core 3, which is a soft magnetic body, could be increased in volume. However, this undesirably increases the dimensions of the current sensors 1 and 101. As another technique to avoid magnetic saturation of the flux concentrating core 3, for example, the width W3 of the core gap CG could be enlarged to thereby enhance magnetic resistance of the magnetic circuit. In such a case, however, the magnetic detector 2 would be more easily affected by a disturbance magnetic field if the magnetic shield 4 is not provided as in the current sensor 101. In this regard, in the current sensor 1 according to the present example embodiment, the magnetic shield 4 is disposed in the core gap CG. This makes it possible to mitigate the influence of the disturbance magnetic field on the magnetic detector 2 while avoiding magnetic saturation of the flux concentrating core 3 by enlarging the width W3 of the core gap CG and thereby enhancing the magnetic resistance of the magnetic circuit.

Figure 11:
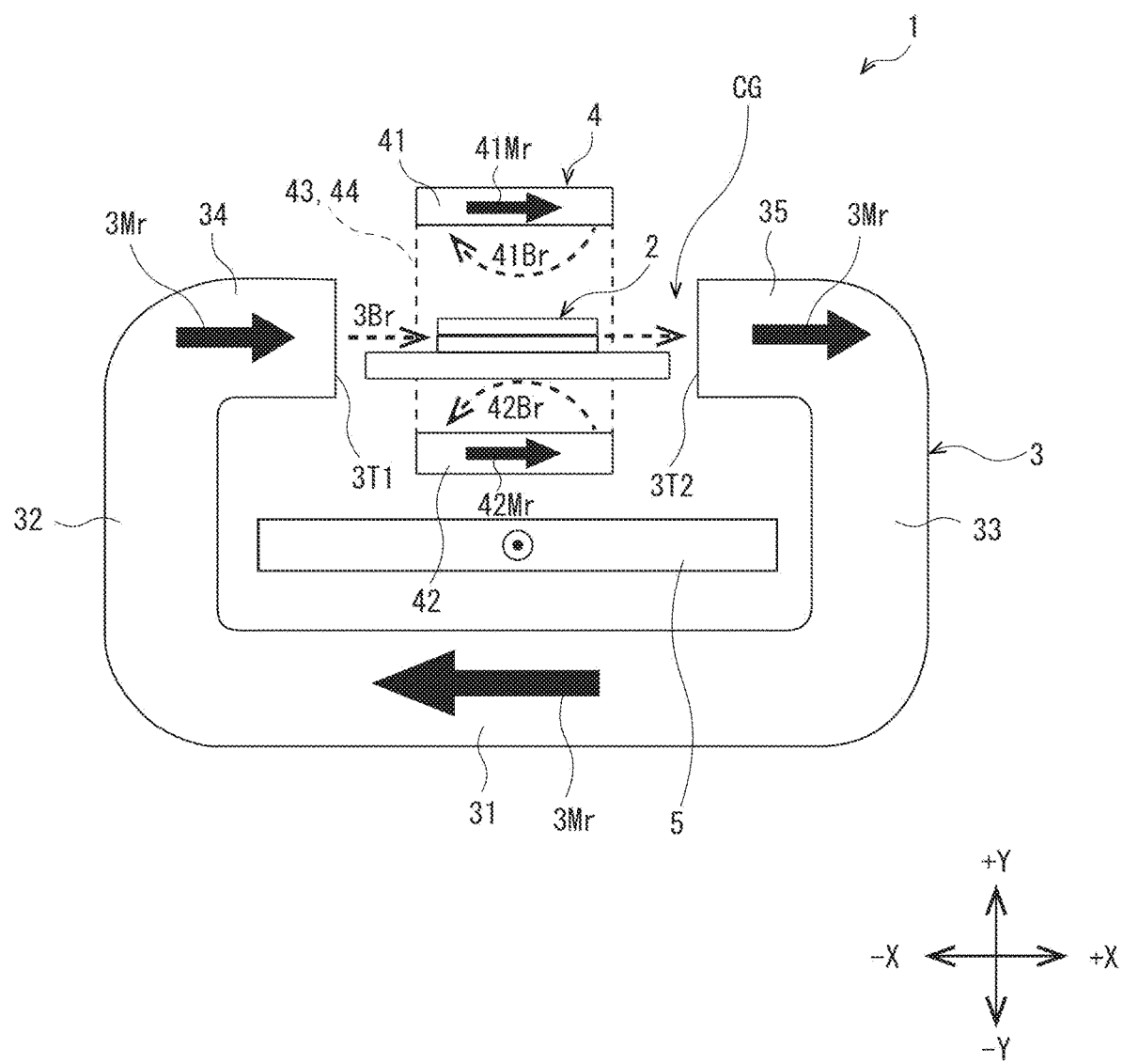
FIG. 11 is a fourth explanatory diagram for describing the example workings and effects of the current sensor illustrated in FIG. 1.

Furthermore, the current sensor 1 according to the present example embodiment provides an effect of reducing influences of a residual magnetization of the flux concentrating core 3 and a residual magnetization of the magnetic shield 4. As a result of application of the magnetic flux Bm to the flux concentrating core 3 and the magnetic shield 4 that are soft magnetic bodies, residual magnetizations develop in the flux concentrating core 3 and the magnetic shield 4, as illustrated in FIG. 11. For example, in the flux concentrating core 3, a residual magnetization 3Mr in the −X direction develops in the first core part 31, and a residual magnetization 3Mr in the +X direction develops in each of the fourth core part 34 and the fifth core part 35. As a result, a residual magnetic flux 3Br in the +X direction develops in the core gap CG. In the magnetic shield 4, for example, a residual magnetization 41Mr in the +X direction develops in the first shield part 41, and a residual magnetization 42Mr in the +X direction develops in the second shield part 42. As a result, in the core gap CG, a residual magnetic flux 41Br develops around the first shield part 41, and a residual magnetic flux 42Br develops around the second shield part 42. The residual magnetic flux 41Br and the residual magnetic flux 42Br are applied to the magnetic detector 2 in the −X direction. Therefore, in the vicinity of the magnetic detector 2, the residual magnetic flux 3Br in the +X direction and the residual magnetic fluxes 41Br and 42Br in the −X direction cancel each other out, resulting in sufficient reduction in the residual magnetic fluxes to be substantially applied to the magnetic detector 2. This make it possible for the magnetic detector 2 to accurately detect the magnetic flux Bm to be detected, without being substantially affected by the residual magnetizations 3Mr of the flux concentrating core 3 or the residual magnetizations 41Mr and 42Mr of the magnetic shield 4. A region where the residual magnetic flux 3Br of the flux concentrating core 3 and the residual magnetic fluxes 41Br and 42Br of the magnetic shield 4 cancel each other out is providable at one or two locations. Appropriately selecting the materials and dimensions of the first shield part 41 and the second shield part 42 is sufficient. Note that FIG. 11 is a fourth explanatory diagram for describing the example workings and effects of the current sensor 1.

As described above, the current sensor 1 according to the present example embodiment makes it possible to mitigate the influence of a magnetic flux of an unwanted disturbance magnetic field from surroundings on the magnetic detector 2, while the magnetic flux Bm to be detected is allowed to reach the magnetic detector 2. As a result, it is possible to detect the magnetic flux Bm with high accuracy and to measure, with high accuracy, the magnitude of the current Im flowing through the conductor 5.

Modification Example of First Example Embodiment

[Modification Example 1-1]

Figure 12:
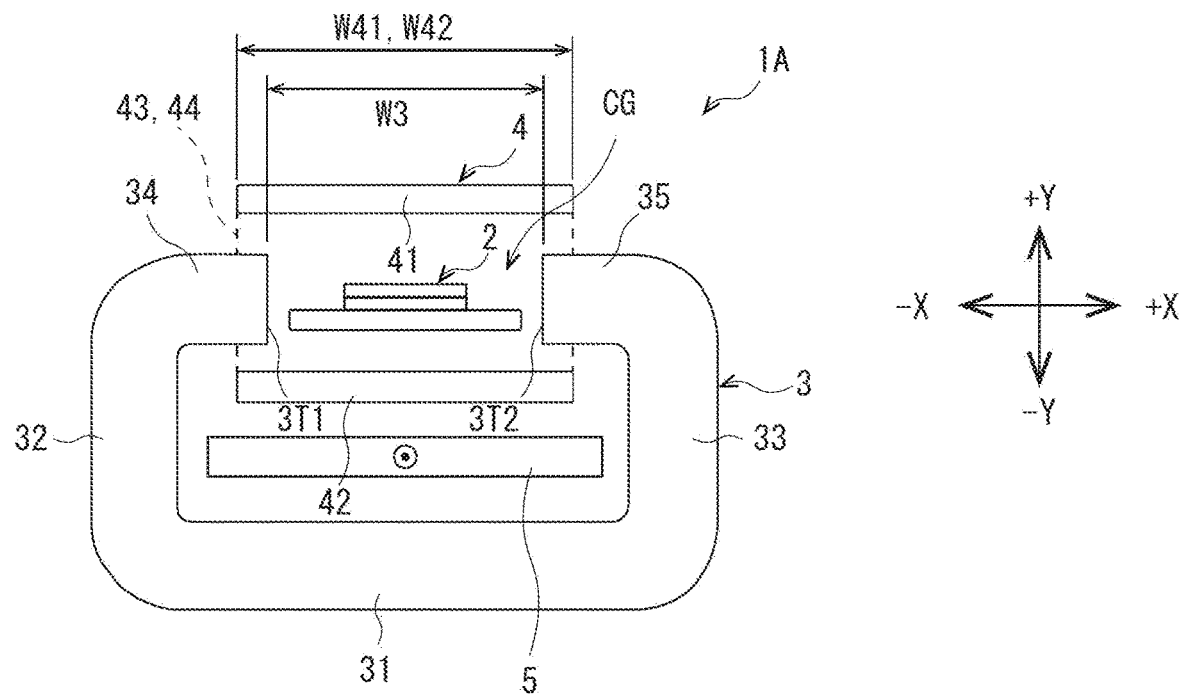
FIG. 12 is a schematic cross-sectional view of a current sensor according to one modification example of one example embodiment of the technology.

FIG. 12 is a schematic cross-sectional view of a current sensor 1A according to a first modification example (Modification Example 1-1) of the first example embodiment described above. In the current sensor 1 of the first example embodiment described above, as illustrated in FIG. 2A, for example, the respective widths W41 and W42 of the first shield part 41 and the second shield part 42 of the magnetic shield 4 may each be smaller than the width W3 of the core gap CG of the flux concentrating core 3 (i.e., W41<W3, and W42<W3). In contrast, in the current sensor 1A according to Modification Example 1-1, as illustrated in FIG. 12, the respective widths W41 and W42 of the first shield part 41 and the second shield part 42 of the magnetic shield 4 may each be greater than the width W3 of the core gap CG of the flux concentrating core 3 (i.e., W41>W3, and W42>W3). Thus, a first end in the X-axis direction of the first shield part 41 and a first end in the X-axis direction of the second shield part 42 may overlap a portion of the fourth core part 34 in the Y-axis direction, and a second end in the X-axis direction of the first shield part 41 and a second end in the X-axis direction of the second shield part 42 may overlap a portion of the fifth core part 35 in the Y-axis direction. The current sensor 1A may have a configuration substantially the same as that of the current sensor 1 except for the above-described difference. Note that the widths W41 and W42 may each be set to, for example, a range from 5 mm to 11 mm, both inclusive, and the width W3 may be set to, for example, a range from 4 mm to 10 mm, both inclusive.

According to the current sensor 1A of Modification Example 1-1, the width W41 of the first shield part 41 and the width W42 of the second shield part 42 may be greater than the width W3 of the core gap CG. In this case, it is possible to prevent a component of the disturbance magnetic field, such as the magnetic field component Hx along the X-axis direction, from affecting the magnetic detector 2. In other words, it is possible to enhance the shield effect against the magnetic field component Hx. However, this configuration will cause the magnetic flux Bm passing through the magnetic detector 2 in the X-axis direction to attenuate, as compared with that in the current sensor 1 according to the first example embodiment described above.

[Modification Example 1-2]

Figure 13:
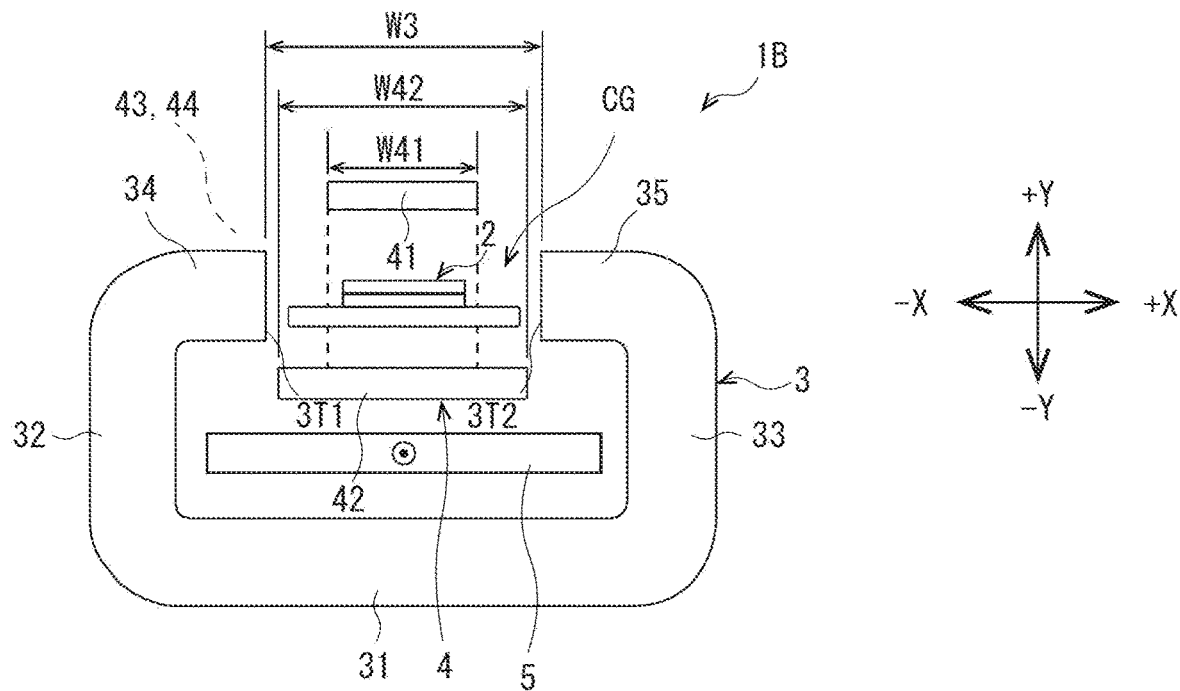
FIG. 13 is a schematic cross-sectional view of a current sensor according to one modification example of one example embodiment of the technology.

FIG. 13 is a schematic cross-sectional view of a current sensor 1B according to a second modification example (Modification Example 1-2) of the first example embodiment described above. In the current sensor 1 of the first example embodiment described above, as illustrated in FIG. 2A, for example, the width W41 of the first shield part 41 of the magnetic shield 4 may be substantially equal to the width W42 of the second shield part 42 (i.e., W41=W42). In contrast, in the current sensor 1B according to Modification Example 1-2, as illustrated in FIG. 13, the width W42 of the second shield part 42 of the magnetic shield 4 may be greater than the width W41 of the first shield part 41 (i.e., W41<W42). However, the width W42 of the second shield part 42 may be smaller than the width W3 of the core gap CG of the flux concentrating core 3 (i.e., W42<W3). In this regard, the current sensor 1B is the same as the current sensor 1. Further, the width W41 of the first shield part 41 and the width W3 of the core gap CG in the current sensor 1B may be substantially the same as those in the current sensor 1. Note that the width W42 may be set to, for example, a range from 5 mm to 11 mm, both inclusive. The current sensor 1B may have a configuration substantially the same as that of the current sensor 1 except that the width W42 of the second shield part 42 is greater than the width W41 of the first shield part 41.

According to the current sensor 1B of Modification Example 1-2, the width W42 of the second shield part 42 may be greater than the width W41 of the first shield part 41 and smaller than the width W3 of the core gap CG. In other words, W41<W42<W3 may be satisfied. In this case, it is possible to further reduce the influence of the residual magnetizations on the magnetic detector 2, as compared with the current sensor 1 and the current sensor 1A, for example.

[Modification Example 1-3]

Figure 14:
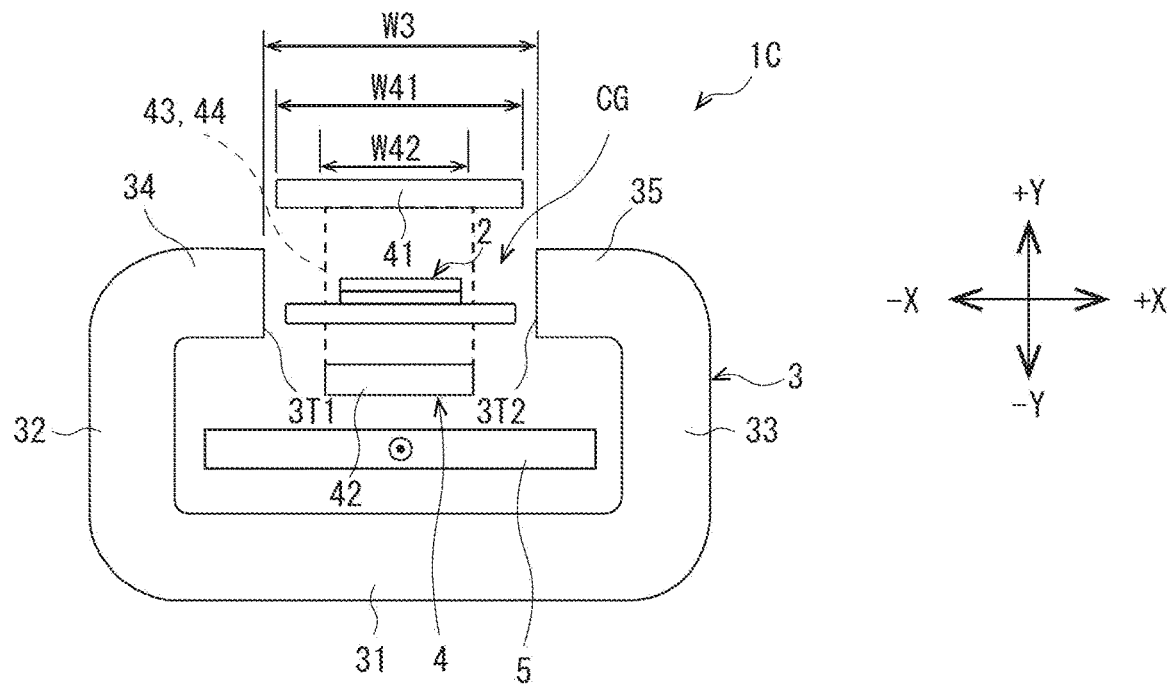
FIG. 14 is a schematic cross-sectional view of a current sensor according to one modification example of one example embodiment of the technology.

FIG. 14 is a schematic cross-sectional view of a current sensor 1C according to a third modification example (Modification Example 1-3) of the first example embodiment described above. In the current sensor 1 of the first example embodiment described above, as illustrated in FIG. 2A, for example, the width W41 of the first shield part 41 of the magnetic shield 4 may be substantially equal to the width W42 of the second shield part 42 (i.e., W41=W42). In contrast, in the current sensor 1C according to Modification Example 1-3, as illustrated in FIG. 14, the width W41 of the first shield part 41 of the magnetic shield 4 may be greater than the width W42 of the second shield part 42 (i.e., W41>W42). However, the width W41 of the first shield part 41 may be smaller than the width W3 of the core gap CG of the flux concentrating core 3 (i.e., W41<W3). In this regard, the current sensor 1C is the same as the current sensor 1. Further, the width W42 of the second shield part 42 and the width W3 of the core gap CG in the current sensor 1C may be substantially the same as those in the current sensor 1. Note that the width W41 may be set to, for example, a range from 5 mm to 11 mm, both inclusive. The current sensor 1C may have a configuration substantially the same as that of the current sensor 1 except that the width W41 of the first shield part 41 is greater than the width W42 of the second shield part 42.

According to the current sensor 1C of Modification Example 1-3, the width W41 of the first shield part 41 may be greater than the width W42 of the second shield part 42 and smaller than the width W3 of the core gap CG. In other words, W42<W41<W3 may be satisfied. In this case, it is possible to further reduce the influence of the residual magnetizations on the magnetic detector 2, as compared with the current sensors 1 and 1A, for example. Further, it is possible to prevent a component of the disturbance magnetic field, such as the magnetic field component Hx along the X-axis direction, from affecting the magnetic detector 2, as compared with the current sensors 1 and 1B. However, the current sensor 1A of Modification Example 1-1 is higher in shield effect against the magnetic field component Hx than the current sensor 1C of Modification Example 1-3. On the other hand, in the current sensor 1C of Modification Example 1-3, it is harder for the magnetic flux Bm passing through the magnetic detector 2 to attenuate than in the current sensor 1A of Modification Example 1-1.

[Modification Example 1-4]

Figure 15:
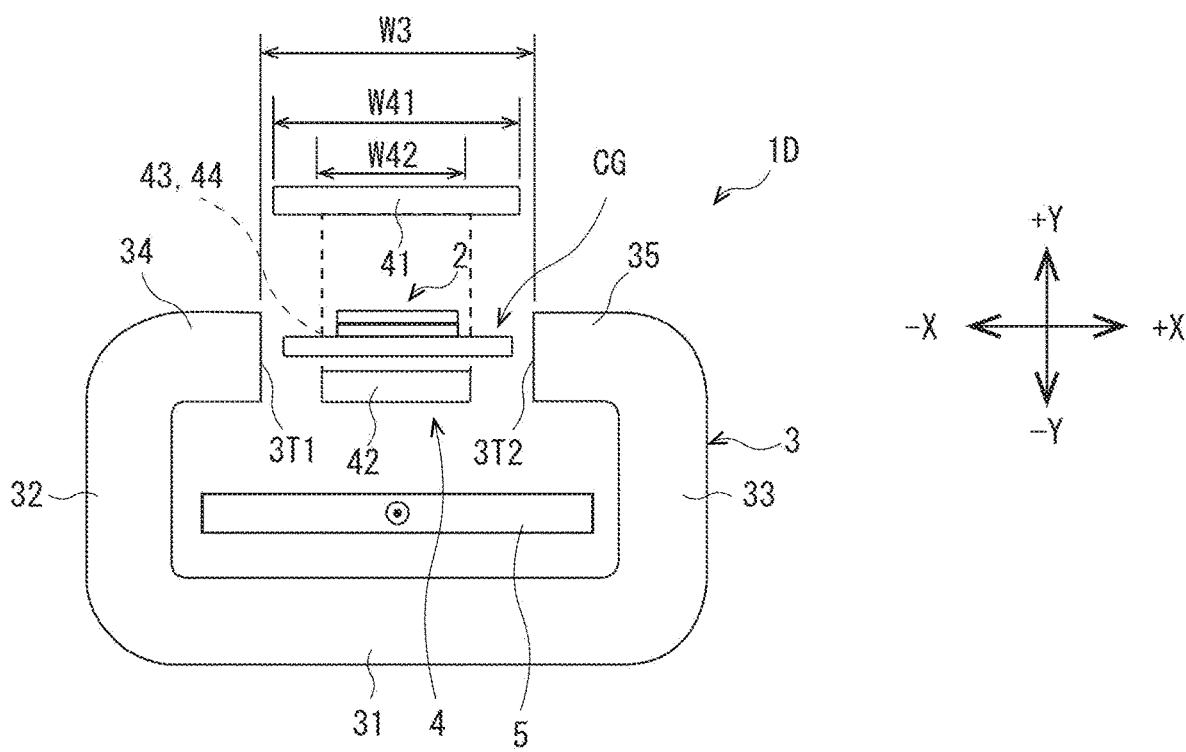
FIG. 15 is a schematic cross-sectional view of a current sensor according to one modification example of one example embodiment of the technology.

FIG. 15 is a schematic cross-sectional view of a current sensor 1D according to a fourth modification example (Modification Example 1-4) of the first example embodiment described above. In the current sensor 1C according to Modification Example 1-3 described above, the second shield part 42 may be disposed between the core gap CG and the conductor 5 in the Y-axis direction. In contrast, in the current sensor 1D according to Modification Example 1-4, the second shield part 42 may be disposed in the core gap CG. The current sensor 1D according to Modification Example 1-4 may have a configuration substantially the same as that of the current sensor 1C according to Modification Example 1-3 except that the second shield part 42 is disposed in the core gap CG.

According to the current sensor 1D of Modification Example 1-4, it is possible to further reduce the influence of the residual magnetizations on the magnetic detector 2, as compared with the current sensors 1 to 1C, for example. However, the current sensor 1D is lower in shield effect against the magnetic field component Hx than the current sensors 1A and 1C. In addition, it is easier for the magnetic flux Bm passing through the magnetic detector 2 to attenuate in the current sensor 1D than in the current sensors 1, 1B, and 1C.

[Modification Example 1-5]

Figure 16:
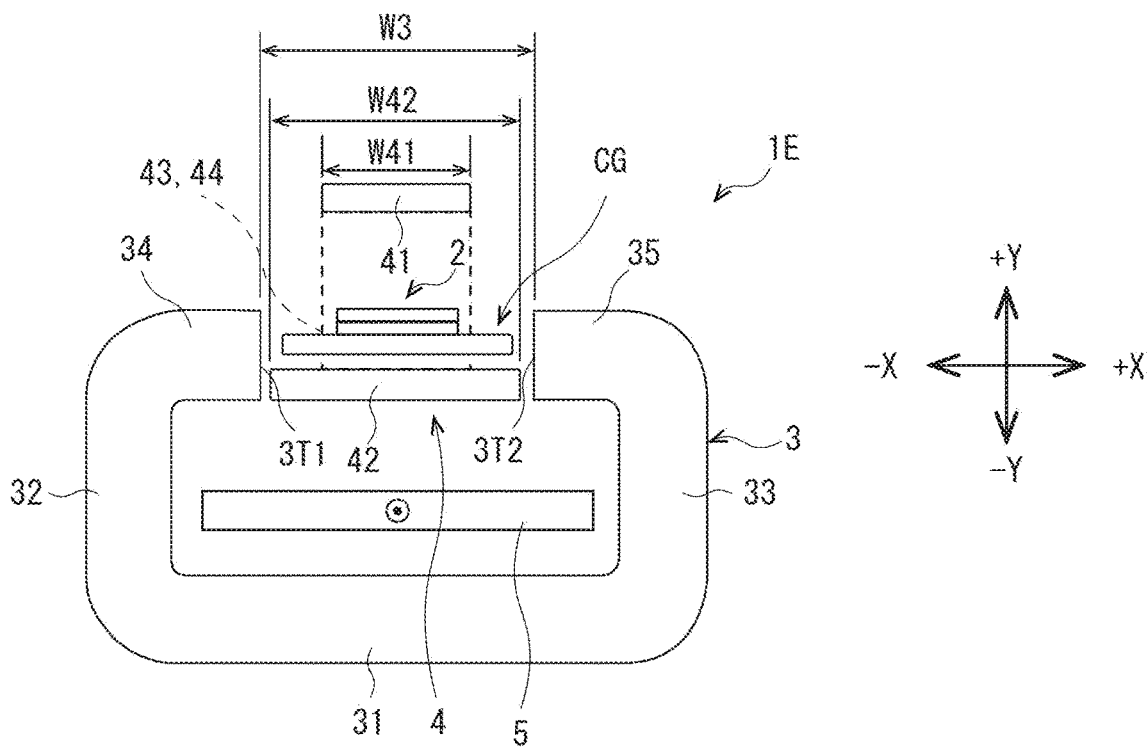
FIG. 16 is a schematic cross-sectional view of a current sensor according to one modification example of one example embodiment of the technology.

FIG. 16 is a schematic cross-sectional view of a current sensor 1E according to a fifth modification example (Modification Example 1-5) of the first example embodiment described above. In the current sensor 1D according to Modification Example 1-4, the width W41 of the first shield part 41 may be greater than the width W42 of the second shield part 42 and smaller than the width W3 of the core gap CG (i.e., W42<W41<W3). In contrast, in the current sensor 1E according to Modification Example 1-5, as illustrated in FIG. 16, the width W42 of the second shield part 42 of the magnetic shield 4 may be greater than the width W41 of the first shield part 41 and smaller than the width W3 of the core gap CG (i.e., W41<W42<W3). Except for this point, the current sensor 1E according to Modification Example 1-5 is substantially the same in configuration as the current sensor 1D according to Modification Example 1-4.

According to the current sensor 1E of Modification Example 1-4, it is possible to further reduce the influence of the residual magnetizations on the magnetic detector 2, as compared with the current sensors 1 to 1C, for example. However, the current sensor 1E is lower in shield effect against the magnetic field component Hx than the current sensors 1A and 1C. In addition, it is easier for the magnetic flux Bm passing through the magnetic detector 2 to attenuate in the current sensor 1E than in the current sensors 1, 1B, and 1C.

[Modification Example 1-6]

Figure 17:
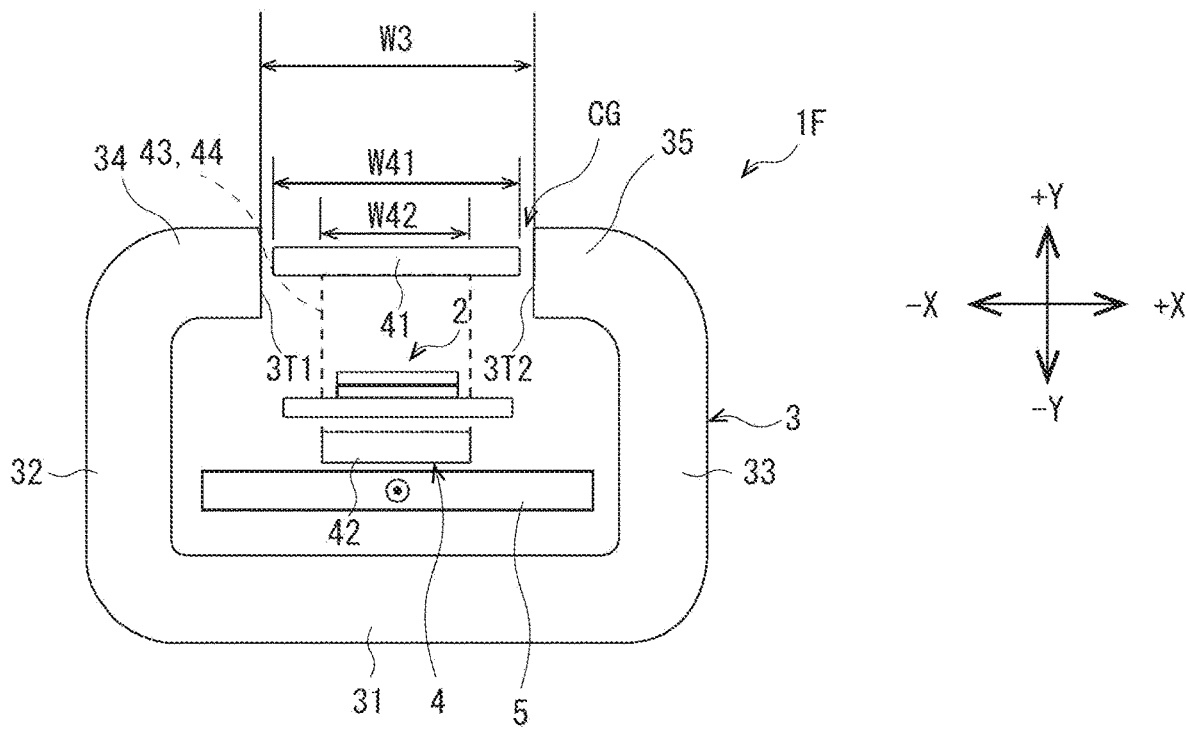
FIG. 17 is a schematic cross-sectional view of a current sensor according to one modification example of one example embodiment of the technology.

FIG. 17 is a schematic cross-sectional view of a current sensor IF according to a sixth modification example (Modification Example 1-6) of the first example embodiment described above. In the current sensor 1D according to Modification Example 1-4 described above, the second shield part 42 may be disposed in the core gap CG. In contrast, in the current sensor IF according to Modification Example 1-6, the first shield part 41 may be disposed in the core gap CG. The current sensor IF according to Modification Example 1-6 may have a configuration substantially the same as that of the current sensor 1D according to Modification Example 1-4 except that the first shield part 41 is disposed in the core gap CG.

According to the current sensor IF of Modification Example 1-6, it is possible to further enhance the shield effect against the magnetic field component Hx and suppress the attenuation of the magnetic flux Bm passing through the magnetic detector 2, as compared with the current sensor 1D, for example.

[Modification Example 1-7]

Figure 18:
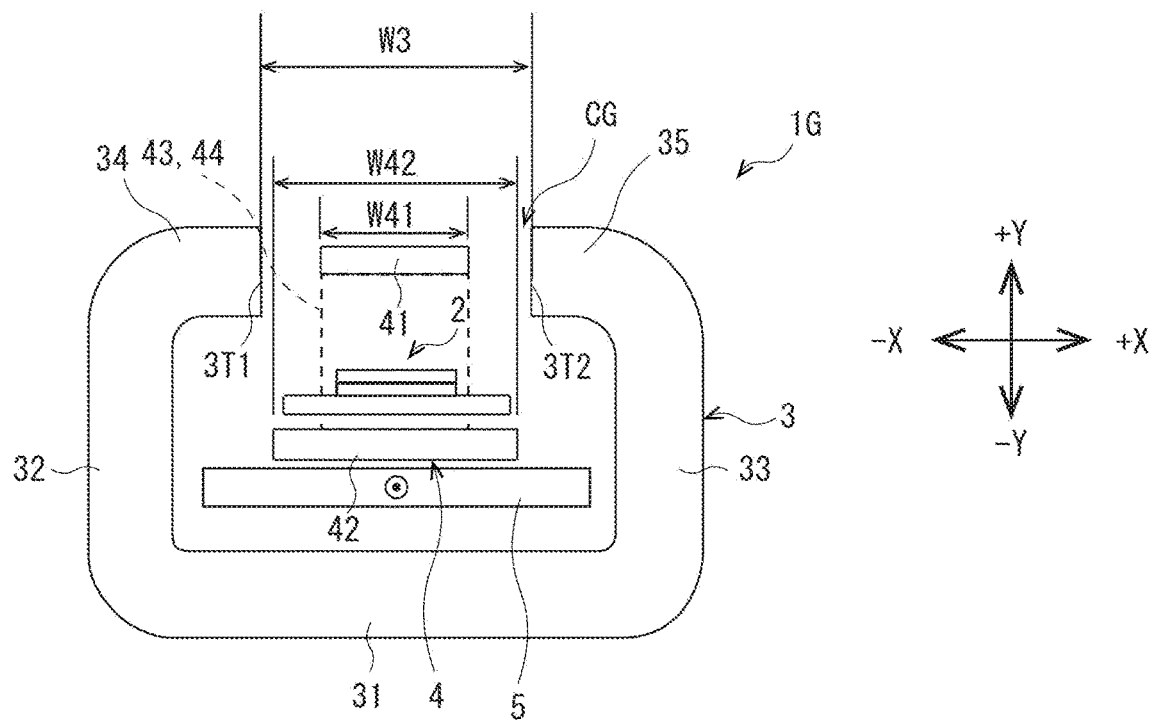
FIG. 18 is a schematic cross-sectional view of a current sensor according to one modification example of one example embodiment of the technology.

FIG. 18 is a schematic cross-sectional view of a current sensor 1G according to a seventh modification example (Modification Example 1-7) of the first example embodiment described above. In the current sensor 1E according to Modification Example 1-5 described above, the second shield part 42 may be disposed in the core gap CG. In contrast, in the current sensor 1G according to Modification Example 1-7, the first shield part 41 may be disposed in the core gap CG. The current sensor 1G according to Modification Example 1-7 may have a configuration substantially the same as that of the current sensor 1E according to Modification Example 1-5 except that the first shield part 41 is disposed in the core gap CG.

According to the current sensor 1G of Modification Example 1-7, it is possible to further enhance the shield effect against the magnetic field component Hx and suppress the attenuation of the magnetic flux Bm passing through the magnetic detector 2, as compared with the current sensor 1E, for example.

[Modification Example 1-8]

Figure 19:
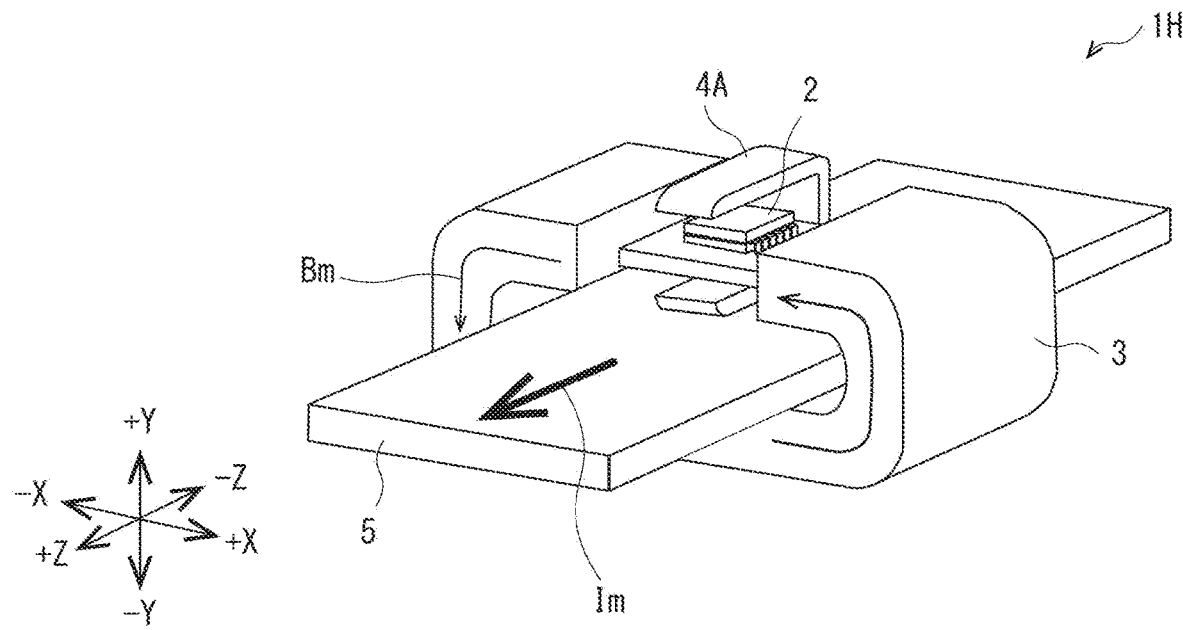
FIG. 19 is a schematic cross-sectional view of a current sensor according to one modification example of one example embodiment of the technology.

FIG. 19 is a schematic cross-sectional view of a current sensor 1H according to an eighth modification example (Modification Example 1-8) of the first example embodiment described above. The current sensor 1 of the first example embodiment may include the magnetic shield 4 that extends fully around the magnetic detector 2 into a doughnut-like shape. In contrast, as illustrated in FIG. 19, the current sensor 1H according to Modification Example 1-8 may include a magnetic shield 4A in place of the magnetic shield 4. The magnetic shield 4A does not include the fourth shield part 44 among the first to fourth shield parts 41 to 44, thus being open in part to have a U-shape in the YZ plane. In the current sensor 1H according to Modification Example 1-8 also, it is possible to reduce the influence of the disturbance magnetic field on the magnetic detector 2 by virtue of the presence of the magnetic shield 4A including the first to third shield parts 41 to 43.

[Modification Example 1-9]

Figure 20:
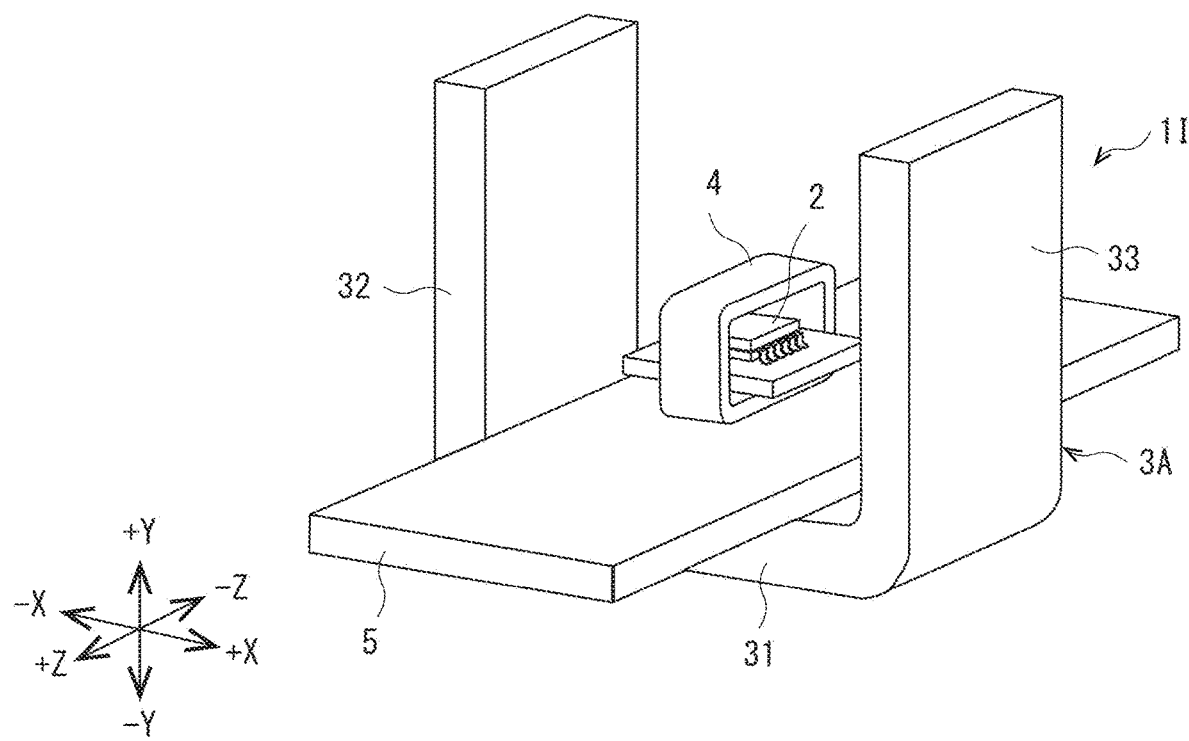
FIG. 20 is a schematic cross-sectional view of a current sensor according to one modification example of one example embodiment of the technology.

FIG. 20 is a perspective diagram illustrating an appearance of a current sensor 11 according to a ninth modification example (Modification Example 1-9) of the first example embodiment described above. The current sensor 1 of the first example embodiment may include the flux concentrating core 3 that includes the first to fifth core parts 31 to 35 surrounding the conductor 5. In contrast, the current sensor 11 according to Modification Example 1-9 may include a flux concentrating core 3A in place of the flux concentrating core 3. As illustrated in FIG. 20, the flux concentrating core 3A includes neither of the fourth core part 34 and the fifth core part 35 among the first to fifth core parts 31 to 35, thus being open in part to have a U-shape in the XY plane. The current sensor 11 according to Modification Example 1-9 also includes the magnetic shield 4, and thus makes it possible to reduce the influence of the disturbance magnetic field on the magnetic detector 2. Note that the current sensor 11 may include the magnetic shield 4A illustrated in FIG. 19 in place of the magnetic shield 4.

[Modification Example 1-10]

Figure 21:
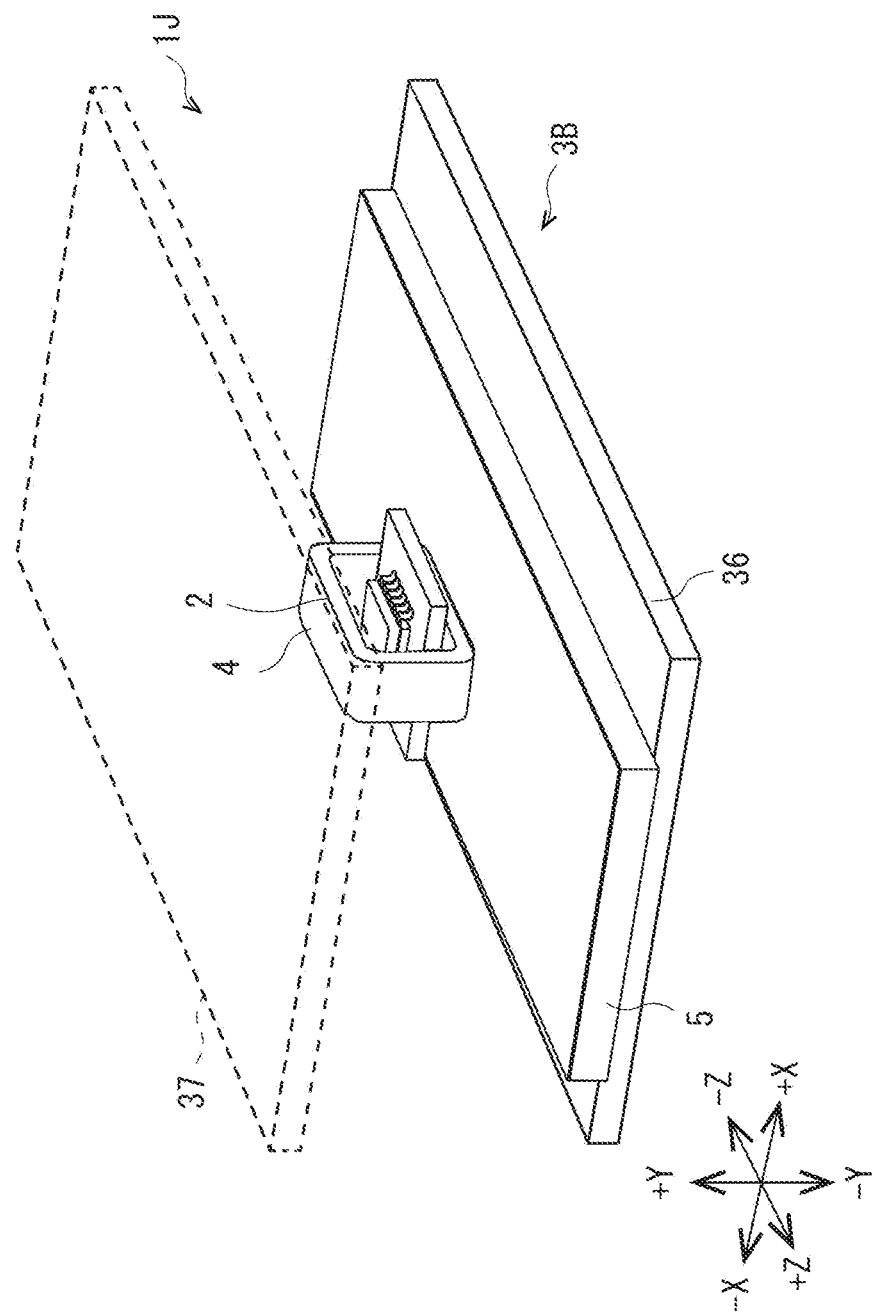
FIG. 21 is a schematic cross-sectional view of a current sensor according to one modification example of one example embodiment of the technology.

FIG. 21 is a perspective diagram illustrating an appearance of a current sensor 1J according to a tenth modification example (Modification Example 1-10) of the first example embodiment described above. The current sensor 1J according to Modification Example 1-10 may include a soft magnetic body 3B in place of the flux concentrating core 3. The soft magnetic body 3B may include two plate-shaped members 36 and 37 extending along the XZ plane. The plate-shaped members 36 and 37 may each include a soft magnetic material as a main constituent material. The plate-shaped members 36 and 37 may be opposed to each other with the magnetic shield 4 and the magnetic detector 2 interposed therebetween in the Y-axis direction. The current sensor 1J according to Modification Example 1-10 also includes the magnetic shield 4, and thus makes it possible to reduce the influence of the disturbance magnetic field on the magnetic detector 2. Note that the current sensor 1J may include the magnetic shield 4A illustrated in FIG. 19 in place of the magnetic shield 4.

Second Example Embodiment

[Configuration of Current Sensor 6]

Figures 22A, 22B:
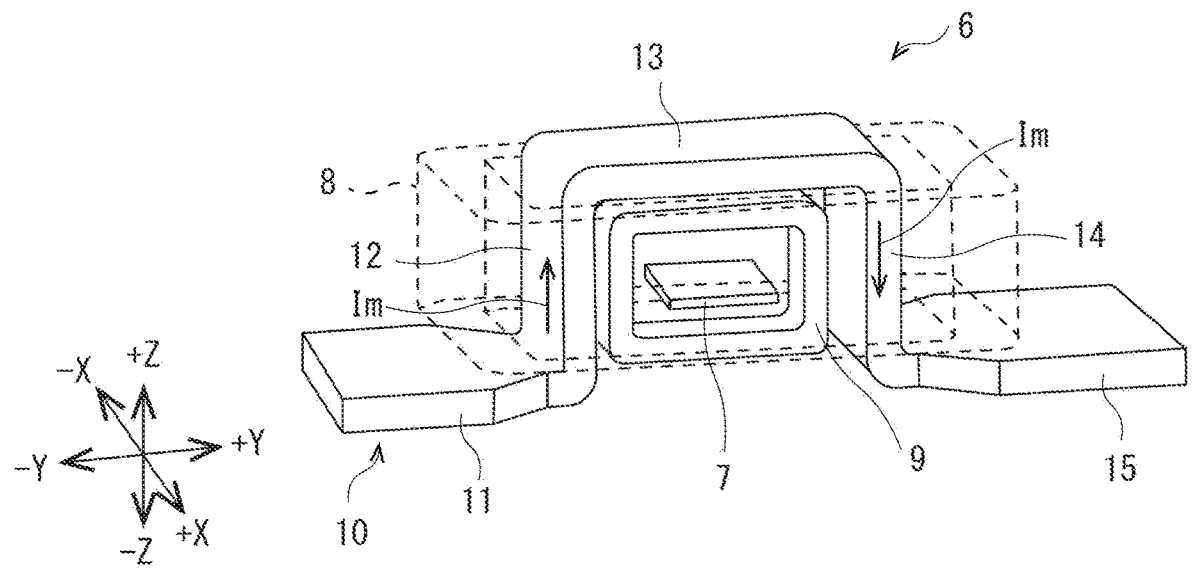
FIG. 22A is a perspective diagram illustrating an overall configuration example of a current sensor according to one example embodiment of the technology.
FIG. 22B is a planar diagram illustrating a configuration example of a magnetic shield of the current sensor illustrated in FIG. 22A.

A configuration of a current sensor 6 according to a second example embodiment of the technology will be described with reference to FIGS. 22A and 22B. FIG. 22A is a perspective diagram illustrating an overall configuration example of the current sensor 6. Referring to FIG. 22A, the current sensor 6 includes, for example, a magnetic detector 7, a flux concentrating core 8, a magnetic shield 9, and a conductor 10.

[Conductor 10]

The conductor 10 may include a first portion 11, a second portion 12, a third portion 13, a fourth portion 14, and a fifth portion 15 that are coupled in this order, for example. The conductor 10 may include, for example, a highly electrically-conductive nonmagnetic material such as copper (Cu). The first portion 11, the third portion 13, and the fifth portion 15 may each extend along the XY plane, for example. The second portion 12 and the fourth portion 14 may each extend along the XZ plane to be upright with respect to the first portion 11, the third portion 13, and the fifth portion 15. The second to fourth portions 12 to 14 may constitute a fold-back portion.

The second portion 12 may correspond to a specific but non-limiting example of a "first conductor portion" according to one embodiment of the technology. The fourth portion 14 may correspond to a specific but non-limiting example of a "second conductor portion" according to one embodiment of the technology.

[Magnetic Detector 7]

The magnetic detector 7 may be disposed in a space defined by the fold-back portion constituted of the second to fourth portions 12 to 14 of the conductor 10. In other words, the magnetic detector 7 may be disposed in a space surrounded by the second to fourth portions 12 to 14. The magnetic detector 7 may have a configuration substantially the same as that of the magnetic detector 2 described in the foregoing first example embodiment.

[Magnetic Shield 9]

The magnetic shield 9 may be a magnetic shield member surrounding the magnetic detector 7 along the YZ plane. That is, the magnetic shield 9 may be a soft magnetic body that mitigates an influence of an unwanted magnetic field (magnetic flux) from the outside, which is other than magnetic flux Bm to be detected, on the magnetic detector 7. The magnetic shield 9 may be disposed in the space surrounded by the second to fourth portions 12 to 14 of the conductor 10. The magnetic shield 9 may be disposed in the space that is further surrounded by the flux concentrating core 8. FIG. 22B is a planar diagram along the YZ plane illustrating a configuration example of the magnetic shield 9 of the current sensor 6 illustrated in FIG. 22A. The magnetic shield 9 may have a configuration substantially the same as that of the magnetic shield 4 described in the foregoing first example embodiment. In one example, as illustrated in FIG. 22B, the magnetic shield 9 may surround the magnetic detector 7 along the YZ plane orthogonal to the X-axis direction, thus having a doughnut-like shape as a whole. Note that "surround the magnetic detector 7" conceptually encompasses not only a configuration in which the magnetic shield 9 extends fully around the magnetic detector 7 into a doughnut-like shape but also a configuration in which the magnetic shield 9 extends partially around the magnetic detector 7 into a partly cutaway doughnut-like shape. The magnetic shield 9 may be spaced from both of the conductor 10 and the magnetic detector 7, being physically in contact with neither of the conductor 10 and the magnetic detector 7.

The magnetic shield 9 may include, for example, a first shield part 91, a second shield part 92, a third shield part 93, and a fourth shield part 94. The first shield part 91 and the second shield part 92 may each extend along the XY plane including the X-axis direction and the Y-axis direction. The third shield part 93 and the fourth shield part 94 may each extend, for example, in the Z-axis direction in which the second portion 12 and the fourth portion 14 of the conductor 10 may extend. The first shield part 91 and the second shield part 92 may be opposed to each other in the Z-axis direction. The first shield part 91 may be disposed, for example, between the third portion 13 of the conductor 10 and the magnetic detector 7 in the Z-axis direction. The second shield part 92 may be disposed on a side opposite to the third portion 13 of the conductor 10 as viewed from the magnetic detector 7. Further, the magnetic detector 7 may be disposed to overlap both of the first shield part 91 and the second shield part 92 as viewed in the Z-axis direction orthogonal to the XY plane. The third shield part 93 and the fourth shield part 94 may be opposed to each other in the Y-axis direction. The third shield part 93 may be provided to magnetically couple a first end 911 in the Y-axis direction of the first shield part 91 and a first end 921 in the Y-axis direction of the second shield part 92 to each other. The fourth shield part 94 may be provided to magnetically couple a second end 912 in the Y-axis direction of the first shield part 91, which is opposite to the first end 911, and a second end 922 in the Y-axis direction of the second shield part 92, which is opposite to the first end 921, to each other. FIG. 22B illustrates an example case where each of the first shield part 91, the second shield part 92, the third shield part 93, and the fourth shield part 94 is so coupled to adjacent shield parts as to be physically in contact therewith; however, embodiments of the technology are not limited to such an example. For example, each of the first shield part 91, the second shield part 92, the third shield part 93, and the fourth shield part 94 only has to be in a state of being magnetically coupled to adjacent shield parts, and does not necessarily have to be physically in contact therewith. The state of being magnetically coupled to adjacent shield parts described here refers to a state of being disposed in such proximity to adjacent shield parts as to be at a distance of, for example, 0.05 mm or less from each adjacent shield part. If two shield parts to be magnetically coupled to each other are disposed at a distance of, for example, 0.1 mm or more from each other, the two shield parts will be magnetically separated from each other to cause a reduction in magnetic shield effect.

The magnetic shield 9 may correspond to a specific but non-limiting example of a "first soft magnetic body" according to one embodiment of the technology. The first shield part 91 may correspond to a specific but non-limiting example of a "first portion" according to one embodiment of the technology. The second shield part 92 may correspond to a specific but non-limiting example of a "second portion" according to one embodiment of the technology. The third shield part 93 may correspond to a specific but non-limiting example of a "third portion" according to one embodiment of the technology. The fourth shield part 94 may correspond to a specific but non-limiting example of a "fourth portion" according to one embodiment of the technology.

[Flux Concentrating Core 8]

The flux concentrating core 8 may be a soft magnetic body that so concentrates the magnetic flux Bm as to allow the magnetic flux Bm to pass therethrough. The flux concentrating core 8 may be provided to surround the magnetic detector 7, the magnetic shield 9, and the second and fourth portions 12 and 14 of the conductor 10 along the XZ plane orthogonal to the Y-axis direction, for example. The flux concentrating core 8 may include substantially the same constituent material as that of the flux concentrating core 3 described in the foregoing first example embodiment.

The flux concentrating core 8 may correspond to a specific but non-limiting example of a "second soft magnetic body" according to one embodiment of the technology.

The flux concentrating core 8 and the magnetic shield 9 may each include, for example, a soft magnetic material such as silicon steel, electromagnetic steel, pure iron (SUY), or permalloy, as a main constituent material. It is easier for the flux concentrating core 8 to be magnetized by application of the magnetic flux Bm than for the magnetic shield 9. Therefore, in one example, a material that is relatively low in residual magnetization, such as FeSi or permalloy, may be used for the flux concentrating core 8. In contrast, it is harder for the magnetic shield 9 to be magnetized with the magnetic flux Bm than for the flux concentrating core 8. Therefore, a material that is relatively high in residual magnetization, such as pure iron, is usable for the magnetic shield 9.

In one example, the constituent material of the magnetic shield 9 may be higher in core loss than the constituent material of the flux concentrating core 8.

[Example Workings and Effects of Current Sensor 6]

Figure 23:
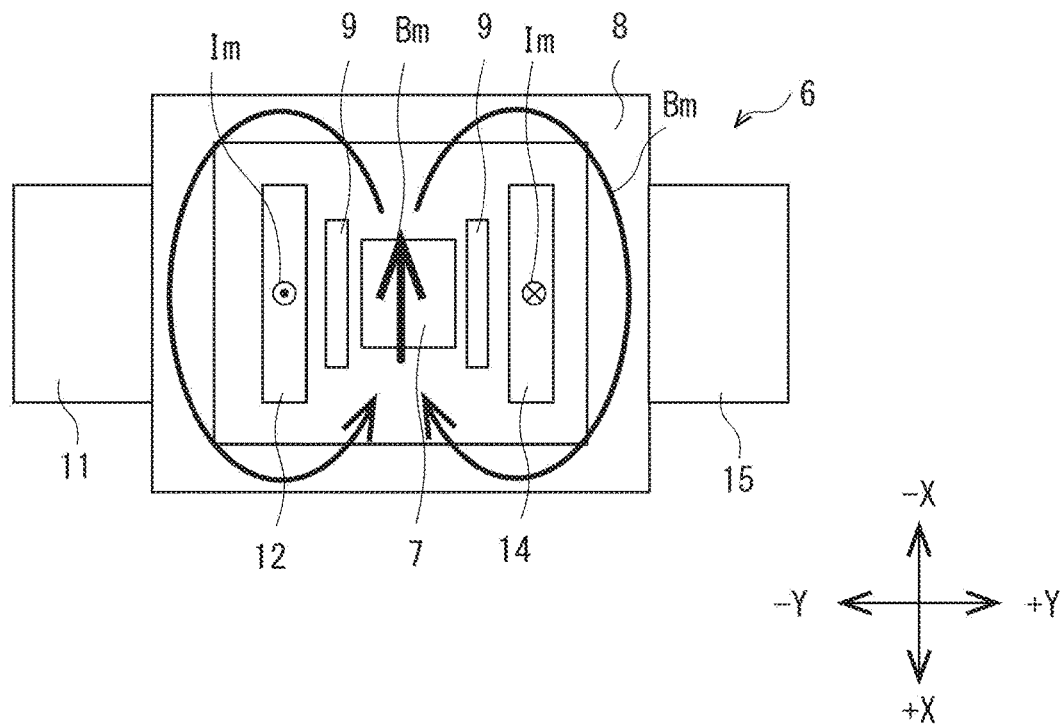
FIG. 23 is an explanatory diagram illustrating example workings of the current sensor illustrated in FIG. 22A.

FIG. 23 illustrates a cross section along the XY plane of the current sensor 6 as viewed in a −Z direction. In the current sensor 6, when a current Im flows through the second portion 12 of the conductor 10 in the +Z direction, a magnetic flux Bm1 is generated around the second portion 12. The magnetic flux Bm1 is applied to the magnetic detector 7 in the −X direction along the X-axis direction. The current Im passes from the second portion 12 through the third portion 13 to flow through the fourth portion 14 in the −Z direction. As a result, a magnetic flux Bm2 is generated around the fourth portion 14. The magnetic flux Bm2 is applied to the magnetic detector 7 in the −X direction along the X-axis direction. Therefore, in the vicinity of the magnetic detector 7, the magnetic flux Bm1 and the magnetic flux Bm2 are combined into a high-density magnetic flux Bm, and the magnetic flux Bm is applied to the magnetic detector 7. According to the current sensor 6, it is therefore possible to detect a current value with high sensitivity even if the current Im is relatively weak.

According to the current sensor 6, the magnetic shield 9 is provided to surround the magnetic detector 7. This mitigates the influence of a magnetic flux of an unwanted disturbance magnetic field from surroundings on the magnetic detector 7. The current sensor 6 thus makes it possible to detect the magnetic flux Bm with high accuracy and to measure, with high accuracy, the magnitude of the current Im flowing through the conductor 10.

[Modification Example 2-1]

Figure 24:
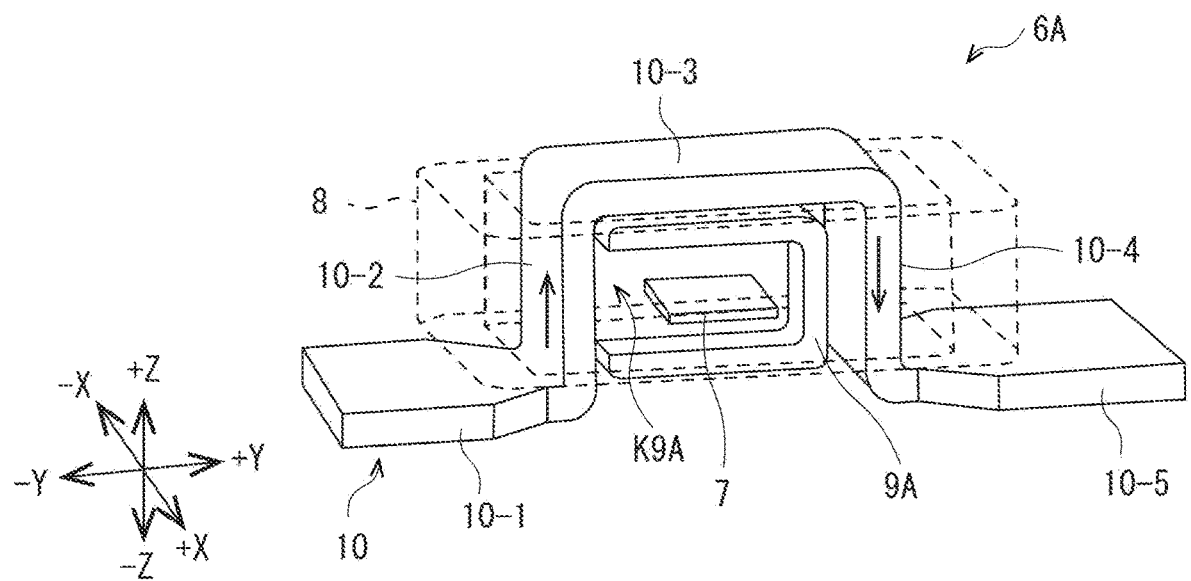
FIG. 24 is a perspective diagram illustrating an overall configuration example of a current sensor according to one modification example of one example embodiment of the technology.

FIG. 24 is a perspective diagram illustrating an appearance of a current sensor 6A according to a first modification example (Modification Example 2-1) of the second example embodiment described above. The current sensor 6 of the second example embodiment described above may include the magnetic shield 9 that extends fully around the magnetic detector 7 into a doughnut-like shape. In contrast, as illustrated in FIG. 24, the current sensor 6A according to Modification Example 2-1 may include a magnetic shield 9A in place of the magnetic shield 9. The magnetic shield 9A may be in a doughnut-like shape with a cutaway portion K9A, thus being open in part to have a U-shape in the YZ plane. In the current sensor 6A according to Modification Example 2-1, the presence of the magnetic shield 9A makes it possible to reduce the influence of the disturbance magnetic field on the magnetic detector 7 as compared with a case where the magnetic shield 9A is not provided.

3. Third Example Embodiment

Figure 25:
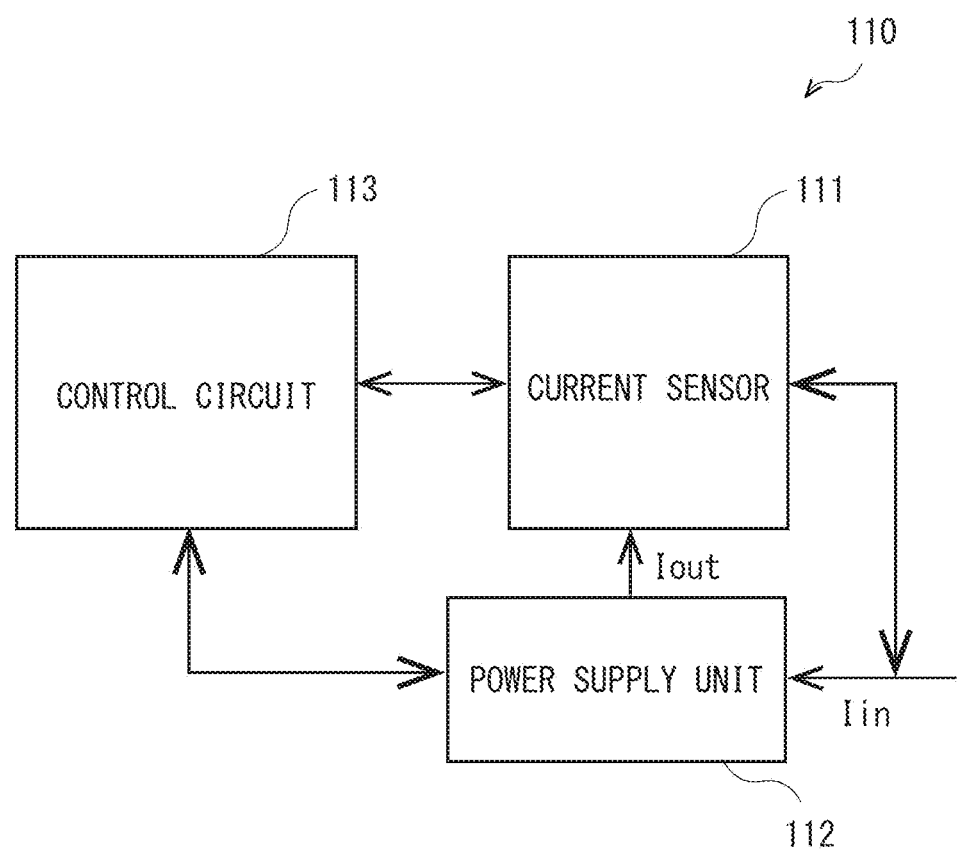
FIG. 25 is a block diagram illustrating a configuration example of an electric control apparatus according to one example embodiment of the technology.

FIG. 25 is a block diagram illustrating a configuration example of an electric control apparatus 110 including a current sensor 111 and other components. Any of the current sensors 1, 1A to 1J, 6, and 6A according to the first example embodiment, the modification examples thereof, the second example embodiment, and the modification example thereof is mountable as the current sensor 111 illustrated in FIG. 25 on the electric control apparatus 110.

The electric control apparatus 110 includes the current sensor 111 as described above, and may further include a power supply unit 112 and a control circuit 113. The current sensor 111 may be configured to measure a current outputted from or inputted to the power supply unit 112. Data related to a current value measured by the current sensor 111 may be transmitted to the control circuit 113. The control circuit 113 may control an operation of the current sensor 111 and an operation of the power supply unit 112, for example. The control circuit 113 may adjust an output current from the power supply unit 112 on the basis of the data from the current sensor 111, for example. Any of the current sensors 1, 1A to 1J, 6, and 6A described in the foregoing example embodiments and modification examples is applicable to the current sensor 111. Examples of the electric control apparatus according to one embodiment of the technology include, without limitation, a battery management system, an inverter, and a converter for vehicles including a hybrid electric vehicle (HEV) and an electric vehicle (EV).

The example embodiments and modification examples described above are to facilitate understanding of the technology, and are not intended to limit the technology. Each element disclosed in the foregoing example embodiments and modification examples shall thus be construed to include all design modifications and equivalents that fall within the technical scope of the technology. In other words, the technology is not limited to the foregoing example embodiments and modification examples, and may be modified in a variety of ways.

The technology encompasses any possible combination of some or all of the various embodiments and the modifications described herein and incorporated herein.

It is possible to achieve at least the following configurations from the foregoing embodiments and modification examples of the technology.

(1)

A current sensor including:

a magnetic detector configured to be subjected to a magnetic flux that is to be generated when a current flows through a conductor along a first axis direction, the magnetic flux being in a second axis direction; and a first soft magnetic body including a first portion, a second portion disposed between the conductor and the first portion, and a third portion magnetically coupling the first portion and the second portion to each other, the first soft magnetic body being spaced from both of the conductor and the magnetic detector, with the first portion, the second portion, and the third portion surrounding the magnetic detector along a first plane orthogonal to the second axis direction.

(2)

The current sensor according to (1), in which the first portion and the second portion each extend along a second plane including the first axis direction and the second axis direction.

(3)

The current sensor according to (2), in which the third portion extends in a third axis direction substantially orthogonal to the second plane.

(4)

The current sensor according to any one of (1) to (3), in which the magnetic detector is disposed to overlap both of the first portion and the second portion as viewed in a third axis direction substantially orthogonal to a second plane including the first axis direction and the second axis direction.

(5)

The current sensor according to any one of (1) to (4), in which the first portion and the second portion each include a first end and a second end opposite to each other in the first axis direction, and the third portion is provided to magnetically couple the first end of the first portion and the first end of the second portion to each other.

(6)

The current sensor according to (5), in which the first soft magnetic body further includes a fourth portion opposed to the third portion in the first axis direction and provided to magnetically couple the second end of the first portion and the second end of the second portion to each other.

(7)

The current sensor according to any one of (1) to (6), further including a second soft magnetic body surrounding the conductor along a third plane orthogonal to the first axis direction.

(8)

The current sensor according to (7), in which the second soft magnetic body includes a first end face and a second end face spaced from and opposed to each other in the second axis direction, and the magnetic detector is disposed in a space between the first end face and the second end face.

(9)

The current sensor according to (7) or (8), in which the first soft magnetic body includes a first constituent material as a main constituent material, and the second soft magnetic body includes a second constituent material as a main constituent material, the first constituent material being higher in core loss than the second constituent material.

(10)

A current sensor including:

a conductor including a first conductor portion and a second conductor portion each extending in a first axis direction, the first conductor portion being configured to generate a first magnetic flux in a second axis direction when a current flows therethrough in a first direction, the second conductor portion being configured to generate a second magnetic flux in the second axis direction when the current flows therethrough in a second direction opposite to the first direction;

a magnetic detector configured to be subjected to the first magnetic flux and the second magnetic flux;

a first soft magnetic body including a first portion, a second portion opposed to the first portion in the first axis direction, and a third portion magnetically coupling the first portion and the second portion to each other, the first soft magnetic body being spaced from both of the conductor and the magnetic detector, with the first portion, the second portion, and the third portion surrounding the magnetic detector along a first plane orthogonal to the second axis direction; and a second soft magnetic body surrounding the magnetic detector, the first conductor portion, and the second conductor portion along a third plane orthogonal to the first axis direction.

(11)

The current sensor according to (10), in which the magnetic detector is disposed to overlap both of the first portion and the second portion as viewed in the first axis direction.

(12)

The current sensor according to (10) or (11), wherein the third portion extends in the first axis direction.

(13)

The current sensor according to any one of (10) to (12), in which the first portion and the second portion each include a first end and a second end opposite to each other in a third axis direction substantially orthogonal to a second plane including the first axis direction and the second axis direction, and the third portion is provided to magnetically couple the first end of the first portion and the first end of the second portion to each other.

(14)

The current sensor according to (13), in which the first soft magnetic body further includes a fourth portion opposed to the third portion in the first axis direction and provided to magnetically couple the second end of the first portion and the second end of the second portion to each other.

(15)

The current sensor according to any one of (10) to (14), in which the first soft magnetic body is disposed in a space surrounded by the second soft magnetic body.

(16)

The current sensor according to any one of (10) to (15), in which the first soft magnetic body includes a first constituent material as a main constituent material, and the second soft magnetic body includes a second constituent material as a main constituent material, the first constituent material being higher in core loss than the second constituent material.

(17)

The current sensor according to any one of (1) to (16), in which the magnetic detector includes a magnetoresistive effect element or a Hall element.

(18)

The current sensor according to (17), in which the magnetoresistive effect element includes a giant magnetoresistive effect element or a tunneling magnetoresistive effect element.

(19)

An electric control apparatus including the current sensor according to any one of (1) to (18).

According to the current sensor of at least one embodiment of the technology, and the electric control apparatus including the same of at least one embodiment of the technology, it is possible to reduce an influence of the disturbance magnetic field on the magnetic detector and to achieve high measurement accuracy.

It should be understood that effects of the embodiments or modification examples of the technology should not be limited to those described herein, and other effects may be achieved.

Although the technology has been described hereinabove in terms of the example embodiments and modification examples, it is not limited thereto. It should be appreciated that variations may be made in the described example embodiment and modification examples by those skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A current sensor comprising:
    a magnetic detector configured to be subjected to a magnetic flux that is to be generated when a current flows through a conductor along a first axis direction, the magnetic flux being in a second axis direction; and
    a first soft magnetic body including a first portion, a second portion disposed between the conductor and the first portion, and a third portion magnetically coupling the first portion and the second portion to each other, the first soft magnetic body being spaced from both of the conductor and the magnetic detector, with the first portion, the second portion, and the third portion surrounding the magnetic detector along a first plane orthogonal to the second axis direction.

2. The current sensor according to claim 1, wherein the first portion and the second portion each extend along a second plane including the first axis direction and the second axis direction.

3. The current sensor according to claim 2, wherein the third portion extends in a third axis direction substantially orthogonal to the second plane.

4. The current sensor according to claim 1, wherein the magnetic detector is disposed to overlap both of the first portion and the second portion as viewed in a third axis direction substantially orthogonal to a second plane including the first axis direction and the second axis direction.

5. The current sensor according to claim 1, wherein
    the first portion and the second portion each include a first end and a second end opposite to each other in the first axis direction, and
    the third portion is provided to magnetically couple the first end of the first portion and the first end of the second portion to each other.

6. The current sensor according to claim 5, wherein the first soft magnetic body further includes a fourth portion opposed to the third portion in the first axis direction and provided to magnetically couple the second end of the first portion and the second end of the second portion to each other.

7. The current sensor according to claim 1, further comprising a second soft magnetic body surrounding the conductor along a third plane orthogonal to the first axis direction.

8. The current sensor according to claim 7, wherein
    the second soft magnetic body includes a first end face and a second end face spaced from and opposed to each other in the second axis direction, and
    the magnetic detector is disposed in a space between the first end face and the second end face.

9. The current sensor according to claim 7, wherein the first soft magnetic body includes a first constituent material as a main constituent material, and the second soft magnetic body includes a second constituent material as a main constituent material, the first constituent material being higher in core loss than the second constituent material.

10. The current sensor according to claim 1, wherein the magnetic detector includes a magnetoresistive effect element or a Hall element.

11. The current sensor according to claim 10, wherein the magnetoresistive effect element comprises a giant magnetoresistive effect element or a tunneling magnetoresistive effect element.

12. An electric control apparatus including the current sensor according to claim 1.

13. A current sensor comprising:
    a conductor including a first conductor portion and a second conductor portion each extending in a first axis direction, the first conductor portion being configured to generate a first magnetic flux in a second axis direction when a current flows therethrough in a first direction, the second conductor portion being configured to generate a second magnetic flux in the second axis direction when the current flows therethrough in a second direction opposite to the first direction;
    a magnetic detector configured to be subjected to the first magnetic flux and the second magnetic flux;
    a first soft magnetic body including a first portion, a second portion opposed to the first portion in the first axis direction, and a third portion magnetically coupling the first portion and the second portion to each other, the first soft magnetic body being spaced from both of the conductor and the magnetic detector, with the first portion, the second portion, and the third portion surrounding the magnetic detector along a first plane orthogonal to the second axis direction; and a second soft magnetic body surrounding the magnetic detector, the first conductor portion, and the second conductor portion along a third plane orthogonal to the first axis direction.

14. The current sensor according to claim 13, wherein the magnetic detector is disposed to overlap both of the first portion and the second portion as viewed in the first axis direction.

15. The current sensor according to claim 13, wherein the third portion extends in the first axis direction.

16. The current sensor according to claim 13, wherein
the first portion and the second portion each include a first end and a second end opposite to each other in a third axis direction substantially orthogonal to a second plane including the first axis direction and the second axis direction, and
the third portion is provided to magnetically couple the first end of the first portion and the first end of the second portion to each other.

17. The current sensor according to claim 16, wherein the first soft magnetic body further includes a fourth portion opposed to the third portion in the first axis direction and provided to magnetically couple the second end of the first portion and the second end of the second portion to each other.

18. The current sensor according to claim 13, wherein the first soft magnetic body is disposed in a space surrounded by the second soft magnetic body.

19. The current sensor according to claim 13, wherein the first soft magnetic body includes a first constituent material as a main constituent material, and the second soft magnetic body includes a second constituent material as a main constituent material, the first constituent material being higher in core loss than the second constituent material.

* * * * *